US012572010B2

(12) United States Patent
Suzuki et al.

(10) Patent No.: US 12,572,010 B2
(45) Date of Patent: Mar. 10, 2026

(54) OPTICAL UNIT, OPTICAL DEVICE, AND METHOD FOR MANUFACTURING OPTICAL UNIT

(71) Applicant: HAMAMATSU PHOTONICS K.K., Hamamatsu (JP)

(72) Inventors: Daiki Suzuki, Hamamatsu (JP);
Katsumi Shibayama, Hamamatsu (JP);
Takafumi Yokino, Hamamatsu (JP);
Yuki Morinaga, Hamamatsu (JP);
Takuma Osaki, Hamamatsu (JP);
Naoto Sakurai, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 773 days.

(21) Appl. No.: 17/791,947

(22) PCT Filed: Oct. 1, 2020

(86) PCT No.: PCT/JP2020/037451
§ 371 (c)(1),
(2) Date: Jul. 11, 2022

(87) PCT Pub. No.: WO2021/145031
PCT Pub. Date: Jul. 22, 2021

(65) Prior Publication Data
US 2023/0038491 A1 Feb. 9, 2023

(30) Foreign Application Priority Data
Jan. 17, 2020 (JP) ................................. 2020-006137

(51) Int. Cl.
*G02B 26/00* (2006.01)
*B81B 3/00* (2006.01)
*G02B 26/10* (2006.01)

(52) U.S. Cl.
CPC .......... *G02B 26/105* (2013.01); *B81B 3/0072* (2013.01); *B81B 2201/042* (2013.01)

(58) Field of Classification Search
CPC .............. G02B 26/105; G02B 26/0858; G02B 26/0833; G02B 26/101; B81B 3/0072;
(Continued)

(56) References Cited

U.S. PATENT DOCUMENTS

2009/0115918 A1 5/2009 Asai
2014/0226194 A1* 8/2014 Mihara ................ G02B 26/105
359/198.1
2016/0069754 A1 3/2016 Gu-Stoppel et al.

FOREIGN PATENT DOCUMENTS

CN 102959454 A 3/2013
CN 104062754 A 9/2014
(Continued)

OTHER PUBLICATIONS

International Preliminary Report on Patentability mailed Jul. 28, 2022 for PCT/JP2020/037451.

*Primary Examiner* — Henry Duong
(74) *Attorney, Agent, or Firm* — Faegre Drinker Biddle & Reath LLP

(57) ABSTRACT

A base, which has a main surface and a back surface on an opposite side from the main surface and is made of metal, an optical surface provided on the main surface, and a vibrating element provided on the main surface or the back surface are included, in which the base has a support portion, a first extending portion and a second extending portion extending from the support portion, a movable portion disposed between the first extending portion and the second extending portion, and a first connecting portion connecting the first extending portion and the movable portion to each other, and
(Continued)

a second connecting portion connecting the second extending portion and the movable portion to each other.

11 Claims, 22 Drawing Sheets

(58) Field of Classification Search
CPC .......... B81B 2201/042; B81B 2201/04; H10N
30/20
USPC ...................................................... 359/199.4
See application file for complete search history.

(56) References Cited

FOREIGN PATENT DOCUMENTS

| | | | | |
|---|---|---|---|---|
| CN | 104749770 | A | 7/2015 | |
| EP | 3012678 | A1 * | 4/2016 | ......... G02B 26/0858 |
| JP | 2005-107069 | A | 4/2005 | |
| JP | 2008191619 | A * | 8/2008 | |
| JP | 2010-002783 | A | 1/2010 | |
| JP | 2011186104 | A * | 9/2011 | |
| JP | 2011-215354 | A | 10/2011 | |
| JP | 2012-194294 | A | 10/2012 | |
| JP | 2013-027942 | A | 2/2013 | |
| JP | 2016-085442 | A | 5/2016 | |
| JP | 2019-218234 | A | 12/2019 | |
| WO | WO-2013/046612 | A1 | 4/2013 | |
| WO | WO-2019/009397 | A1 | 1/2019 | |

* cited by examiner (a)

(b)

(a)

(b)

(a)

(b)

(a)

(b)

(a)

(b)

(a)

(b)

(a)

(b)

(a)

(b)

(a)

(b)

(a)

(b)

OPTICAL UNIT, OPTICAL DEVICE, AND METHOD FOR MANUFACTURING OPTICAL UNIT

TECHNICAL FIELD

The present disclosure relates to an optical unit, an optical device, and a method for manufacturing the optical unit.

BACKGROUND ART

Patent Literature 1 describes an optical scanning device including a mirror vibrating portion. The mirror vibrating portion has a substrate and a piezoelectric element provided on the substrate. A mirror portion is attached to the substrate through a twisted beam. Further, an oscillator and a twisted beam supporting the oscillator are formed on the outside of the mirror portion and the twisted beam supporting the mirror portion. The mirror portion and the oscillator form a two-oscillator system, and are designed to have resonance frequencies f and 2f, or f and 3f. The piezoelectric element is connected to a variable frequency drive circuit. In this mirror vibrating portion, the piezoelectric element expands and contracts due to application of a voltage to the piezoelectric element, so that a plate wave is generated on the substrate, vibration energy of the plate wave causes the mirror portion supported by the beam to swing, and rotational moment is applied to the mirror portion.

CITATION LIST

Patent Literature

Patent Literature 1: Japanese Unexamined Patent Publication No. 2010-2783

SUMMARY OF INVENTION

Technical Problem

Incidentally, when a metal plate is used as a substrate in an optical device such as the optical scanning device as described above, light used for scanning may be reflected by a part other than the mirror portion to become stray light. Generation of stray light may cause deterioration of optical characteristics of the optical scanning device.

Therefore, an object of the present disclosure is to provide an optical unit, an optical device, and a method for manufacturing the optical unit capable of improving optical characteristics.

Solution to Problem

An optical unit according to the present disclosure includes a base having a main surface and a back surface on an opposite side from the main surface, and being made of metal, an optical surface provided on the main surface, and a vibrating element provided on the main surface or the back surface, in which the base has a support portion, a first extending portion and a second extending portion extending from the support portion, a movable portion disposed between the first extending portion and the second extending portion, and a first connecting portion connecting the first extending portion and the movable portion to each other, and a second connecting portion connecting the second extending portion and the movable portion to each other, the vibrating element is provided on the support portion, and vibrates the support portion to induce twisting vibration in the first connecting portion and the second connecting portion, thereby oscillating the movable portion, the optical surface is provided on the main surface in the movable portion, and a matte surface is formed on at least a part of at least one of a first region on a side of the movable portion of a position where the vibrating element is provided in the support portion on the main surface, a second region corresponding to the first extending portion and the second extending portion on the main surface, and a third region facing the vibrating element on the main surface or the back surface.

In this optical unit, the vibrating element provided on the support portion of the base induces twisting vibration in the first connecting portion and the second connecting portion of the base, and the movable portion provided with the optical surface is oscillated. Therefore, various optical functions such as optical scanning may be realized by causing light to enter the optical surface that oscillates through the movable portion. In particular, in this optical unit, the matte surface is formed on at least a part of at least any one of the first region on the movable portion side of the position where the vibrating element is provided in the support portion on the main surface of the base provided with the optical surface, the second region corresponding to the first extending portion and the second extending portion, and the third region facing the vibrating element on the main surface or the back surface. The first region and the second region are regions of the main surface, which are relatively close to the optical surface (movable portion) and easily entered by light. Therefore, when the matte surface is formed on the first region and/or the second region, generation of stray light is suppressed. That is, the optical characteristics are improved. Further, when the matte surface is formed on the third region, bonding of the vibrating element to the main surface or the back surface is strengthened. By firmly bonding the vibrating element to the main surface or the back surface, it is possible to reliably induce twisting vibration in the first connecting portion and the second connecting portion, thereby oscillating the optical surface (movable portion). Therefore, even in this case, the optical characteristics are improved.

In the optical unit according to the present disclosure, the vibrating element may be provided on the main surface, and a matte surface may be formed on the first region, the second region, and the third region. In this case, the optical characteristics are reliably improved.

In the optical unit according to the present disclosure, a matte surface may be formed on the entire main surface. In this case, the optical characteristics are reliably improved. Further, in this case, when the matte surface is formed, the entire main surface may be roughened at once, which facilitates manufacturing.

In the optical unit according to the present disclosure, the base may have a side surface connecting the main surface and back surface to each other, and a matte surface may be formed on the entire back surface and side surface. In this case, the optical characteristics are further reliably improved. Further, in this case, when the matte surface is formed, the entire surface of the base including the main surface, the back surface, and the side surface may be roughened at once, which facilitates manufacturing.

In the optical unit according to the present disclosure, the base may have a side surface connecting the main surface and back surface to each other, and at least a part of the side surface may be a flat surface. In this case, strength is improved.

The optical unit according to the present disclosure may further include a stress relaxation portion provided between the optical surface and the first connecting portion and between the optical surface and the second connecting portion to relax stress caused by twist of the first connecting portion and the second connecting portion. In this case, since the movable portion is inhibited from bending, the optical characteristics are further improved.

The optical unit according to the present disclosure may further include an electrode used for electrical connection of the vibrating element to an outside, in which the electrode may include a first portion located on the support portion and the vibrating element and being in contact with the vibrating element, and a second portion provided on the support portion to extend from the first portion toward an outer edge of the support portion. In this case, the vibrating element may be electrically connected to the outside through the electrode by providing wiring such as a wire in the second portion of the electrode extending toward the outer edge of the support portion. Therefore, when compared to the case where the wiring such as the wire is directly extended from the outside to the vibrating element, the wiring such as the wire is shortened and stable connection is possible. Note that the term "outside" mentioned here refers to a part other than the optical unit. In an optical device including the optical unit, for example, the term "outside" may refer to a part inside the optical device on a substrate, etc. on which the optical unit is mounted.

An optical device according to the present disclosure includes the optical unit described above, a light source configured to output light, and a detector disposed on an optical axis of light output from the light source and configured to detect the light, in which the light source and the detector are disposed so that the optical axis interferes with a part of the base by displacement of the base in response to vibration of the vibrating element. According to this optical device, it is possible to detect the amplitude (deflection angle) of oscillation of the optical surface (movable portion) based on output of light output from the light source and detected by the detector without being blocked by the base.

An optical device according to the present disclosure includes an optical unit including a base made of metal, an optical surface provided on the base, and a vibrating element provided on the base, and a package configured to accommodate the optical unit, in which the base has a support portion, a first extending portion and a second extending portion extending from the support portion, a movable portion disposed between the first extending portion and the second extending portion, and a first connecting portion connecting the first extending portion and the movable portion to each other, and a second connecting portion connecting the second extending portion and the movable portion to each other, the vibrating element is provided on the support portion, and vibrates the support portion to induce twisting vibration in the first connecting portion and the second connecting portion, thereby oscillating the movable portion, the optical surface is provided on the movable portion, the package is provided with an opening for causing light to enter the optical surface, and a matte surface is formed on at least a part of a portion exposed from the package through the opening in the base.

In this optical device, the vibrating element provided on the support portion of the base induces twisting vibration in the first connecting portion and the second connecting portion of the base, and the movable portion provided with the optical surface is oscillated. Therefore, various optical functions such as optical scanning may be realized by causing light to enter the optical surface that oscillates through the movable portion. In particular, in this optical device, the matte surface is formed on at least a part of a portion exposed from the package through the opening in the base. The portion exposed from the package through the opening in the base is a portion easily entered by light. Therefore, generation of stray light is suppressed. That is, the optical characteristics are improved.

A method for manufacturing an optical unit according to the present disclosure includes a first process of preparing a metal member, a second process of forming a base from the metal member after the first process, the base having a main surface and a back surface on an opposite side from the main surface, and a third process of roughening at least a part of the base after the second process, in which the base has a support portion, a vibrating element being provided thereon, a first extending portion and a second extending portion extending from the support portion, a movable portion disposed between the first extending portion and the second extending portion, an optical surface being provided on a side of the main surface of the movable portion, and a first connecting portion connecting the first extending portion and the movable portion to each other, and a second connecting portion connecting the second extending portion and the movable portion to each other, and, in the third process, at least a part of at least one of a first region on a side of the movable portion of a position where the vibrating element is provided in the support portion on the main surface, a second region corresponding to the first extending portion and the second extending portion on the main surface, and a third region facing the vibrating element on the main surface or the back surface is roughened.

Alternatively, a method for manufacturing an optical unit according to the present disclosure includes a first process of preparing a metal member, a second process of roughening a surface of the metal member after the first process, and a third process of forming a base from the metal member after the second process, the base having a roughened main surface and a roughened back surface on an opposite side from the main surface, in which the base has a support portion, a vibrating element being provided thereon, a first extending portion and a second extending portion extending from the support portion, a movable portion disposed between the first extending portion and the second extending portion, an optical surface being provided on a side of the main surface of the movable portion, and a first connecting portion connecting the first extending portion and the movable portion to each other, and a second connecting portion connecting the second extending portion and the movable portion to each other.

With any of these manufacturing methods, it is possible to manufacture an optical unit having improved optical characteristics for the reasons described above.

Advantageous Effects of Invention

According to the present disclosure, it is possible to provide an optical unit, an optical device, and a method for manufacturing the optical unit capable of improving optical characteristics.

DESCRIPTION OF EMBODIMENTS

Hereinafter, an embodiment of the present disclosure will be described in detail with reference to the drawings. In each figure, the same elements or the corresponding elements may be designated by the same reference symbols, and overlapping description may be omitted. Further, in each figure, a Cartesian coordinate system defined by an X-axis, a Y-axis, and a Z-axis may be illustrated.

Figure 1:
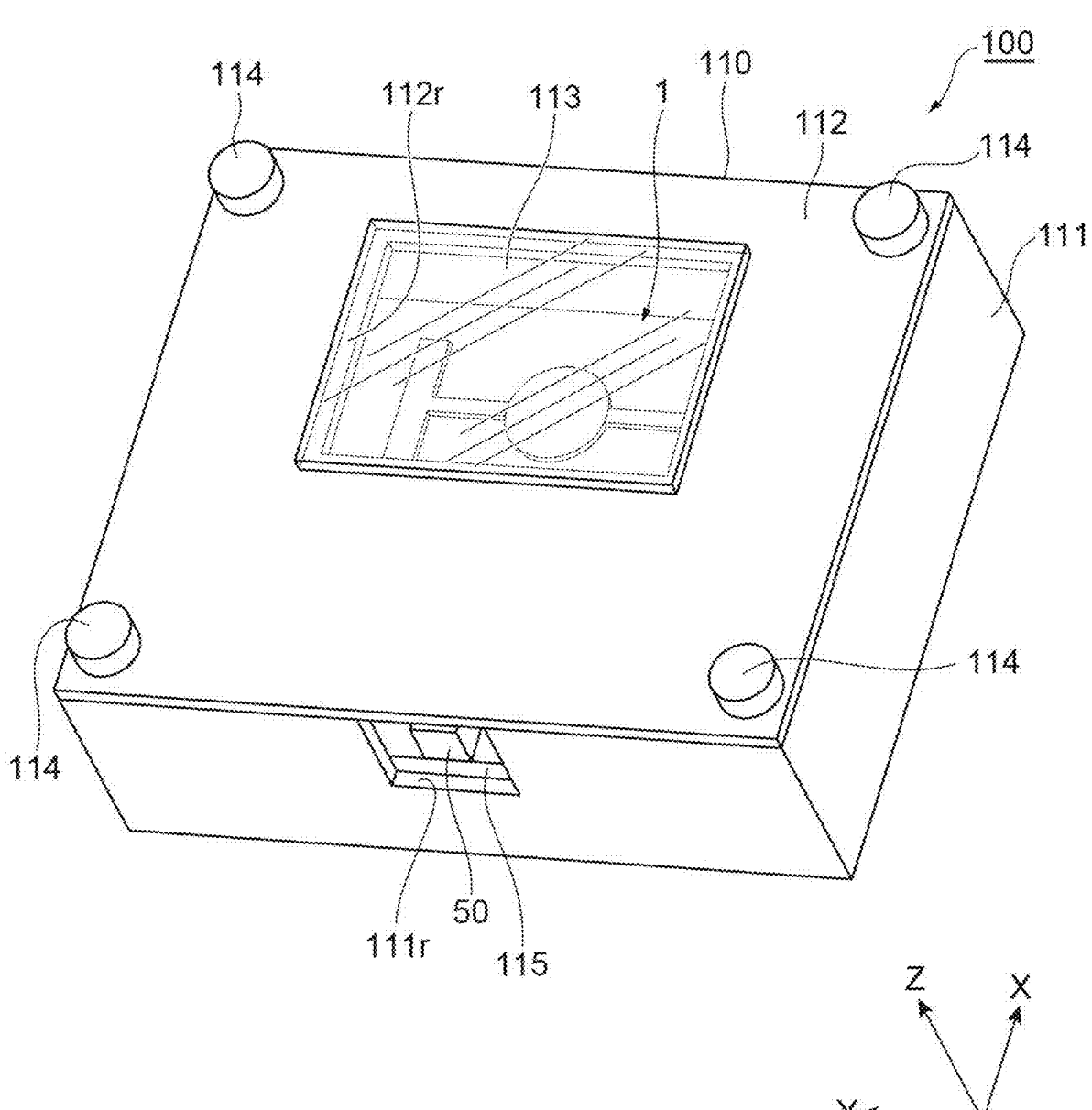
FIG. 1 is a perspective view illustrating an optical device according to an embodiment.
Figure 2:
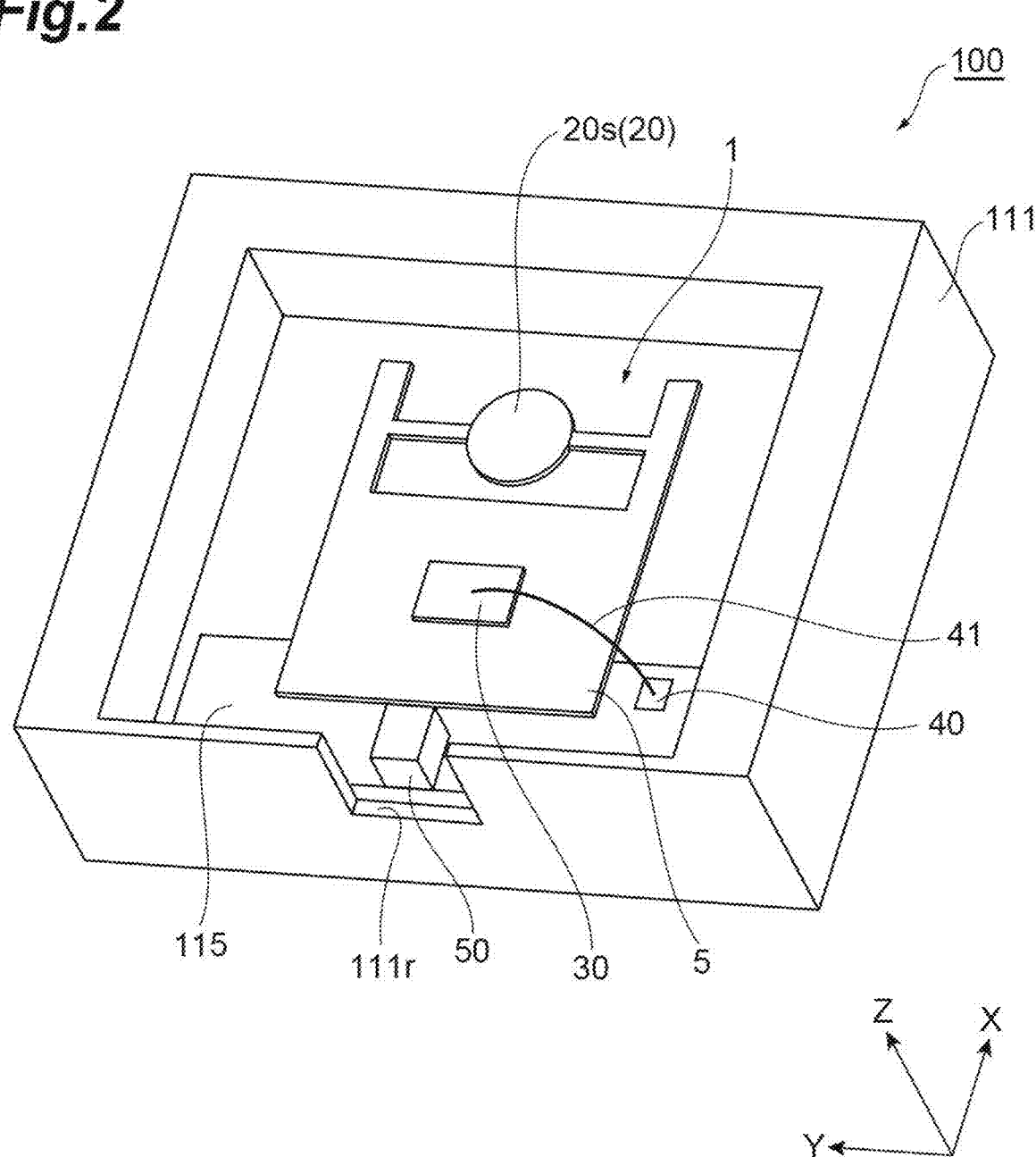
FIG. 2 is a perspective view illustrating the optical device illustrated in FIG. 1 by omitting a part (cover) of the optical device.

FIG. 1 is a perspective view illustrating an optical device according to the present embodiment. FIG. 2 is a perspective view illustrating the optical device illustrated in FIG. 1 by omitting a part (cover) of the optical device. As illustrated in FIGS. 1 and 2, the optical device 100 includes an optical unit 1 and a package 110 that accommodates the optical unit 1. The package 110 has a main body 111 and a lid 112. As an example, the main body 111 has a rectangular box shape with one side open. A notch 111r is formed on one side wall of the main body 111.

The lid 112 is disposed on the main body 111 so as to close an open portion of the main body 111, and is attached to the main body 111 by a fixing member 114 such as a screw. An opening 112r is formed in the lid 112. Here, the opening 112r is sealed by a window member 113 made of a material that transmits light. The window member 113 is parallel to an optical surface 20s and/or a main surface 5s, which will be described later. Note that the opening 112r may be opened without the window member 113 being provided.

The optical device 100 further includes a wiring board 115. The wiring board 115 is provided inside the main body 111 on the side wall side where the notch 111r is formed, and is fixed to the main body 111. The wiring board 115 is provided with an electrode 40 such as a bonding pad and a connector 50. The electrode 40 is electrically connected to one electrode of the optical unit 1 (an upper electrode 31 of a vibrating element 30 described later) through wiring 41 such as a wire. The wiring board 115 is provided with wiring (not illustrated) for electrically connecting the electrode 40 and the connector 50 to each other, and wiring (not illustrated) for electrically connecting another electrode of the optical unit 1 (a lower electrode 32 of the vibrating element 30 described later) and the connector 50 to each other.

That is, the connector 50 is electrically connected to the vibrating element 30 of the optical unit 1. A drive voltage may be applied to the vibrating element 30 from the outside of the optical device 100 through the connector 50. Subsequently, the optical unit 1 will be described.

Figure 3:
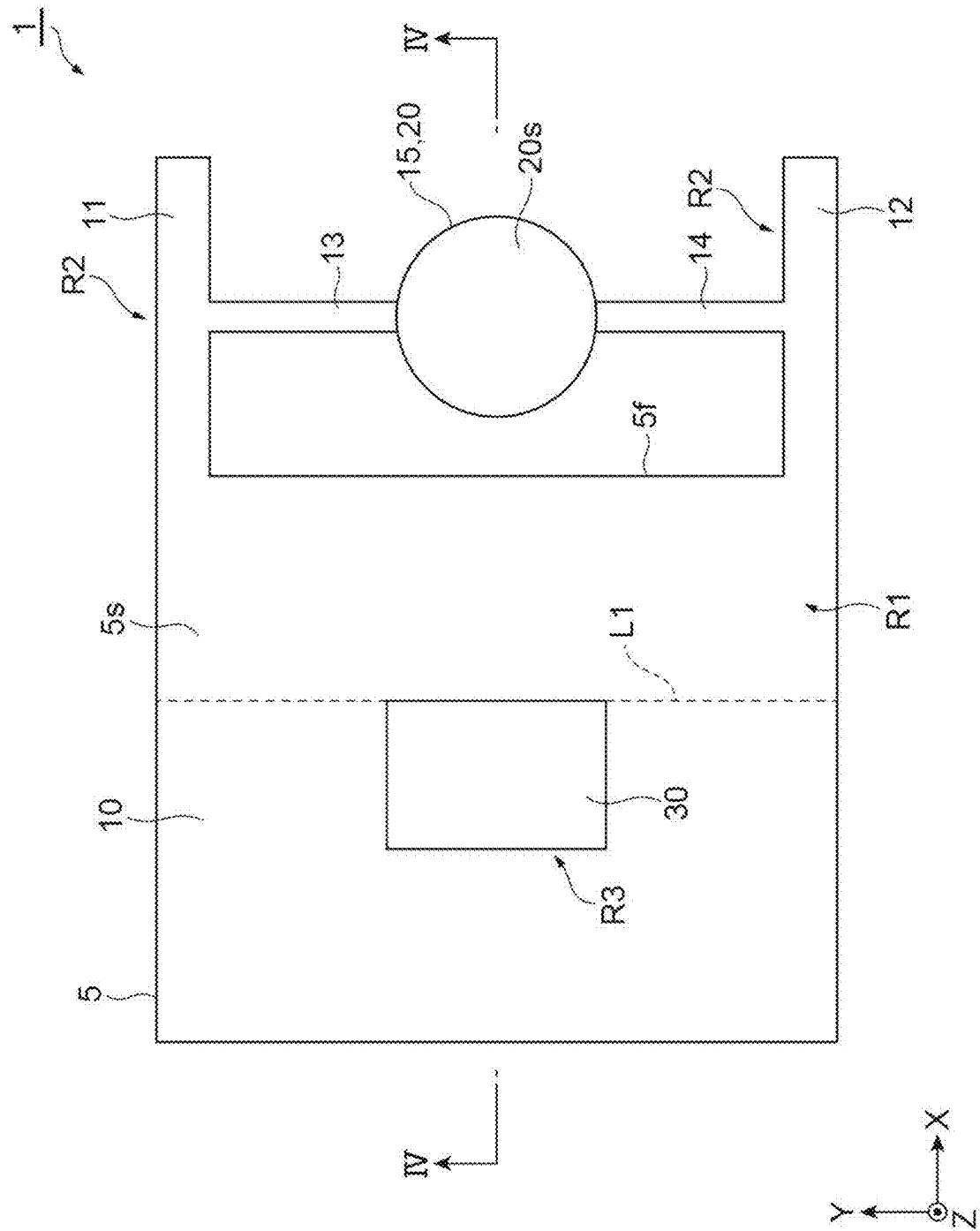
FIG. 3 is a plan view illustrating an optical unit illustrated in FIGS. 1 and 2.
Figure 4:
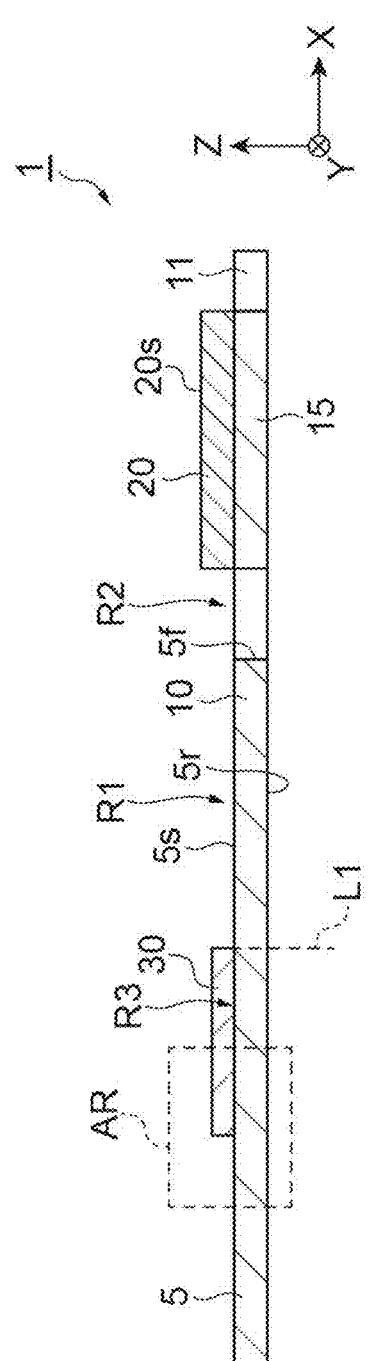
FIG. 4 is a cross-sectional view taken along the line IV-IV of FIG. 3.
Figure 4:
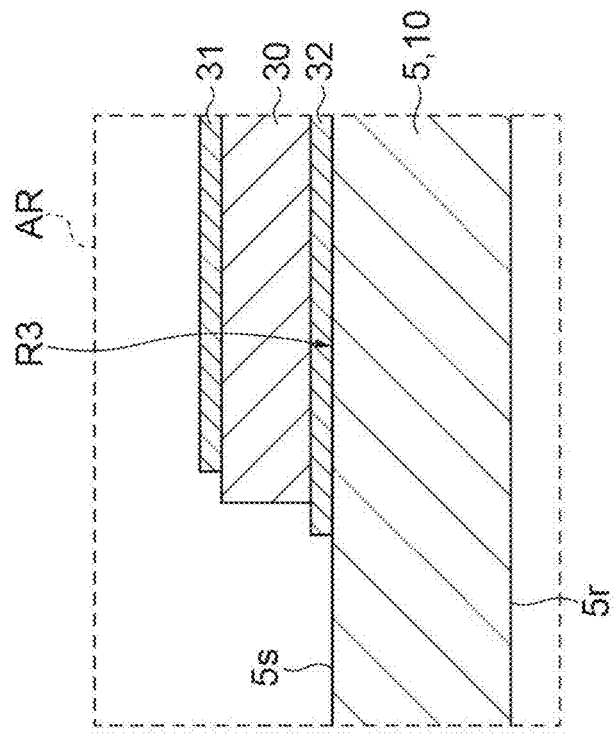

FIG. 3 is a plan view illustrating the optical unit illustrated in FIGS. 1 and 2. FIG. 4 is a cross-sectional view taken along the line IV-IV of FIG. 3. In particular, FIG. 4(b) is an enlarged view of a region AR of FIG. 4(a). As illustrated in FIGS. 3 and 4, the optical unit 1 includes a base 5, the optical surface 20s, and the vibrating element 30. The base 5 is made of, for example, iron-based, stainless steel-based, copper-based, permalloy-based, titanium-based, tungsten-based, molybdenum-based, or other metal, and has a plate shape. The base 5 has the main surface 5s, a back surface 5r on the opposite side from the main surface 5s, and a side surface 5f connecting the main surface 5s and the back surface 5r to each other. Here, a direction from the back surface 5r to the main surface 5s (thickness direction of the base 5) is set to a Z-axis direction. Here, the optical surface 20s and the vibrating element 30 are provided on the main surface 5s of the base 5.

The base 5 has a support portion 10, a first extending portion 11, a second extending portion 12, a first connecting portion 13, a second connecting portion 14, and a movable portion 15. The support portion 10, the first extending portion 11, the second extending portion 12, the first connecting portion 13, the second connecting portion 14, and the movable portion 15 are mutually integrally formed, and all include a part of the main surface of 5s, the back surface 5r, and the side surface 5f. Here, the support portion 10 has a rectangular plate shape. The first extending portion 11 and the second extending portion 12 extend (here, in one direction) from one end of the support portion 10 in a state of being separated from each other.

As an example, the first extending portion 11 and the second extending portion 12 have the same shape and extend parallel to each other so that a distance therebetween along a Y-axis direction is constant. Here, an extending direction of the first extending portion 11 and the second extending portion 12 is set to an X-axis direction, and a direction in which the first extending portion 11 and the second extending portion 12 face each other is set to the Y-axis direction. The first extending portion 11 and the second extending portion 12 each have, for example, a long rectangular plate shape (a rod shape having a rectangular cross section). Here, each of the first extending portion 11 and the second extending portion 12 is supported by the support portion 10 only at one end portion in the X-axis direction, and is regarded as a cantilever. Note that each of the first extending portion 11 and the second extending portion 12 may have a portion extending in a direction intersecting the X-axis direction.

The movable portion 15 is disposed between the first extending portion 11 and the second extending portion 12. More specifically, the movable portion 15 is disposed at an intermediate position between the first extending portion 11 and the second extending portion 12 in the Y-axis direction. The movable portion 15 is formed in a disc shape here, and may have an arbitrary shape depending on the shape of the optical surface 20s, for example.

The first connecting portion 13 extends from the first extending portion 11 along the Y-axis direction and is connected to the movable portion 15. As a result, the first connecting portion 13 connects the first extending portion 11 and the movable portion 15 to each other. The second connecting portion 14 extends from the second extending portion 12 along the Y-axis direction and is connected to the movable portion 15. As a result, the second connecting portion 14 connects the second extending portion 12 and the movable portion 15 to each other. Here, the first connecting portion 13 and the second connecting portion 14 are provided at the same positions as positions of the first extending portion 11 and the second extending portion 12 in the X-axis direction. The first connecting portion 13 and the second connecting portion 14 are located on a single straight line along the Y-axis direction. From a positional relationship between each of the first extending portion 11 and the second extending portion 12 and the movable portion 15 described above, the length of the first connecting portion 13 in the Y-axis direction and the length of the second connecting portion 14 in the Y-axis direction are the same. Here, the first connecting portion 13 and the second connecting portion 14 have the same shape.

Here, the first connecting portion 13 and the second connecting portion 14 each have a long rectangular plate shape (a rod shape having a rectangular cross section). As will be described later, the first connecting portion 13 and the second connecting portion 14 function as torsion bars that elastically deform so as to be twisted according to deformation (displacement) of the first extending portion 11 and the second extending portion 12. The movable portion 15 is supported through the first connecting portion 13 and the second connecting portion 14, and is oscillated around an axis along the Y-axis direction (supported so that the movable portion 15 can oscillate) according to elastic deformation of the first connecting portion 13 and the second connecting portion 14.

The optical unit 1 further includes an optical member 20. Here, the optical member 20 is formed in a disc shape, and one surface thereof is the optical surface 20s. The optical member 20 is attached to the movable portion 15 so that a surface opposite to the optical surface 20s faces the main surface 5s, that is, the optical surface 20s faces an opposite side from the main surface 5s. Therefore, in the optical unit 1, the optical surface 20s is provided on the main surface 5s in the movable portion 15. The optical surface 20s (center of the optical surface 20s) is disposed at an intermediate position between the first extending portion 11 and the second extending portion 12 in the Y-axis direction. Here, the base 5 and the optical surface 20s are line-symmetric with respect to a straight line passing through the center of the optical surface 20s and along the X-axis direction. The optical surface 20s is, for example, a mirror surface (reflective surface). In this case, the optical member 20 is made of, for example, a semiconductor material such as silicon or glass, and the optical surface 20s is formed by forming a reflective film on one surface. Note that the reflective film on one surface of the optical member 20 may be omitted. That is, it is possible to use the one surface of the optical member 20 as the optical surface 20s.

The vibrating element 30 is provided on the support portion 10. Here, the vibrating element 30 is provided on the main surface 5s. The upper electrode 31 is provided on a surface of the vibrating element 30 opposite to the main surface 5s. The lower electrode 32 is provided between the vibrating element 30 and the main surface 5s. The upper electrode 31 is in contact with (electrically connected to) the vibrating element 30. Here, the lower electrode 32 is in contact with (electrically connected) the vibrating element 30 and the support portion 10. That is, the vibrating element 30 is bonded to the main surface 5s by the lower electrode 32. However, a conductive adhesive layer may be interposed between the main surface 5s and the lower electrode 32 and/or between the lower electrode 32 and the vibrating element 30. In this case, the conductive adhesive layer contributes to bonding between the vibrating element 30 and the main surface 5s.

As described above, here, the vibrating element 30 is electrically connected to the base 5 through the lower electrode 32 (and the conductive adhesive layer). The base 5 (that is, the optical unit 1) is fixed to the wiring board 115 by, for example, a conductive adhesive layer or mechanical fixing, and is electrically connected to wiring connected to the connector 50 of the wiring board 115. That is, the vibrating element 30 is electrically connected to the connector 50 through the upper electrode 31, the wiring 41, the electrode 40, and the wiring board 115. Further, the vibrating element 30 is electrically connected to the connector 50 through the lower electrode 32 (and the conductive adhesive layer) and the wiring board 115. Therefore, the upper electrode 31 and the lower electrode 32 are used for electrical connection to the outside of the vibrating element 30 (outside of the optical unit 1).

As a result, the vibrating element 30 vibrates the support portion 10 by deforming and/or vibrating according to the drive voltage applied from the outside through the connector 50. As a result, the vibrating element 30 induces twisting vibration (twisting resonance) in the first connecting portion 13 and the second connecting portion 14 through vibration of the support portion 10, and causes the movable portion 15 and the optical surface 20s to oscillate. That is, in the optical unit 1, by adopting a Lamb wave resonance structure while disposing a twisting resonance system of the first connecting portion 13, the second connecting portion 14, the movable portion 15, and the optical member 20 and the vibrating element 30 at separate positions, twisting resonance is generated with high drive efficiency.

The vibrating element 30 is provided on the support portion 10 so that a center of the vibrating element 30 coincides with centers of the movable portion 15 and the optical surface 20s in the Y-axis direction. That is, the vibrating element 30 is disposed at an intermediate position between the first extending portion 11 and the second extending portion 12 in the Y-axis direction. A position of the vibrating element 30 in the X-axis direction may be arbitrarily set according to the mode of the induced twisting vibration. The vibrating element 30 includes, for example, a piezoelectric body.

In the optical device 100 described above, light (for example, laser light) enters the package 110 through the window member 113 and the opening 112r of the lid 112. The light entering the package 110 is reflected by the optical surface 20s and emitted to the outside through the window member 113 and the opening 112r. The optical surface 20s is periodically oscillated. Therefore, an emission direction of light from the package 110 changes periodically and continuously according to oscillation of the optical surface 20s. As a result, the optical device 100 may function as an optical scanning device. In this case, a scanning direction of light is the X-axis direction.

Here, in the optical unit 1, a matte surface is formed on at least a part of at least any one of a first region R1 on the movable portion 15 side of a position where the vibrating element 30 is provided in the support portion 10 on the main surface 5s, a second region R2 corresponding to the first extending portion 11 and the second extending portion 12 on the main surface 5s, and a third region R3 facing the vibrating element 30 on the main surface 5s. Using a straight line L1 passing through an outer edge of the vibrating element 30 on the movable portion 15 side as a boundary, the first region R1 is a region on the movable portion 15 side (positive side in the X-axis direction) of the straight line L1. The second region R2 is one surface of the first extending portion 11 and the second extending portion 12. The third region R3 is a region that overlaps with the vibrating element 30 when viewed in the Z-axis direction.

In the present embodiment, the matte surface is formed on the entire first region R1, second region R2, and third region R3. More specifically, here, the matte surface is formed on the entire main surface 5s, the entire back surface 5r, and at least a part of the side surface 5f (a region where the matte surface on the side surface 5f is formed will be described later). That is, here, the matte surface is formed on a region corresponding to the first connecting portion 13 and the second connecting portion 14 on the main surface 5s and a region corresponding to the movable portion 15 on the main surface 5s in addition to the above-mentioned first region R1 to third region R3.

Note that the matte surface mentioned here is, for example, a surface having a surface roughness Ra larger than 0.4 (μm). Alternatively, the matte surface mentioned here may be a surface roughened to have a surface roughness Ra of 6.3 (μm) or more. On the other hand, a surface having a surface roughness Ra of less than 6.3 (μm) may be referred to as a flat surface. Further, a surface having a surface roughness Ra of 0.4 (μm) or less may be a mirror surface. In the matte surface, heights or pitches of irregularities may be regular or irregular. Alternatively, in the matte surface, irregularities may have directionality or do not have to have directionality.

Figure 5:
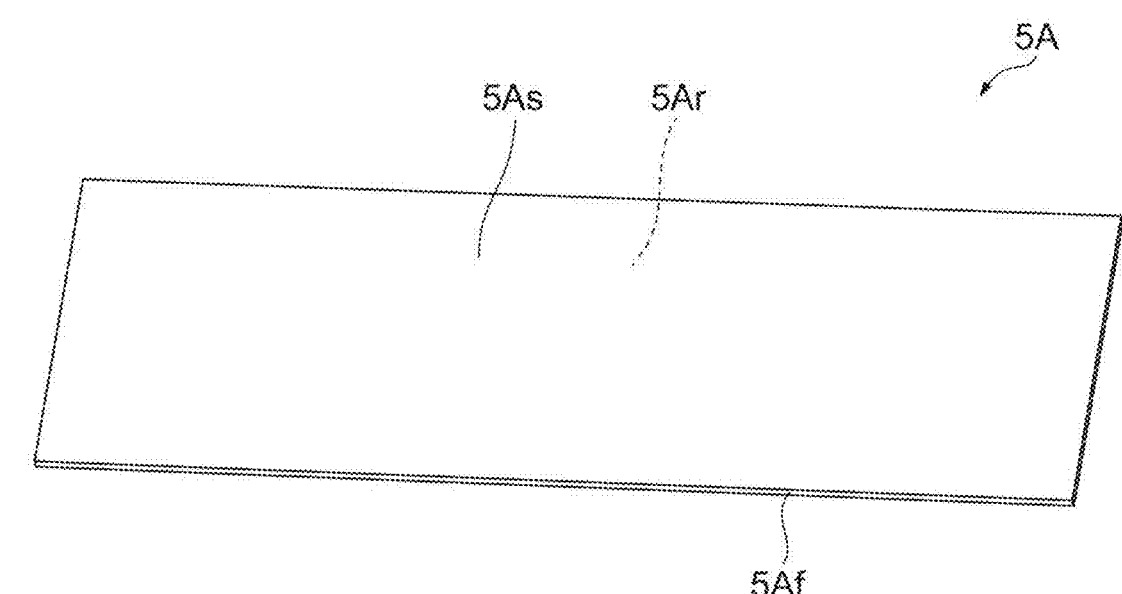
FIG. 5 is a perspective view illustrating a process of a method for manufacturing the optical unit illustrated in FIGS. 3 and 4.
Figure 5:
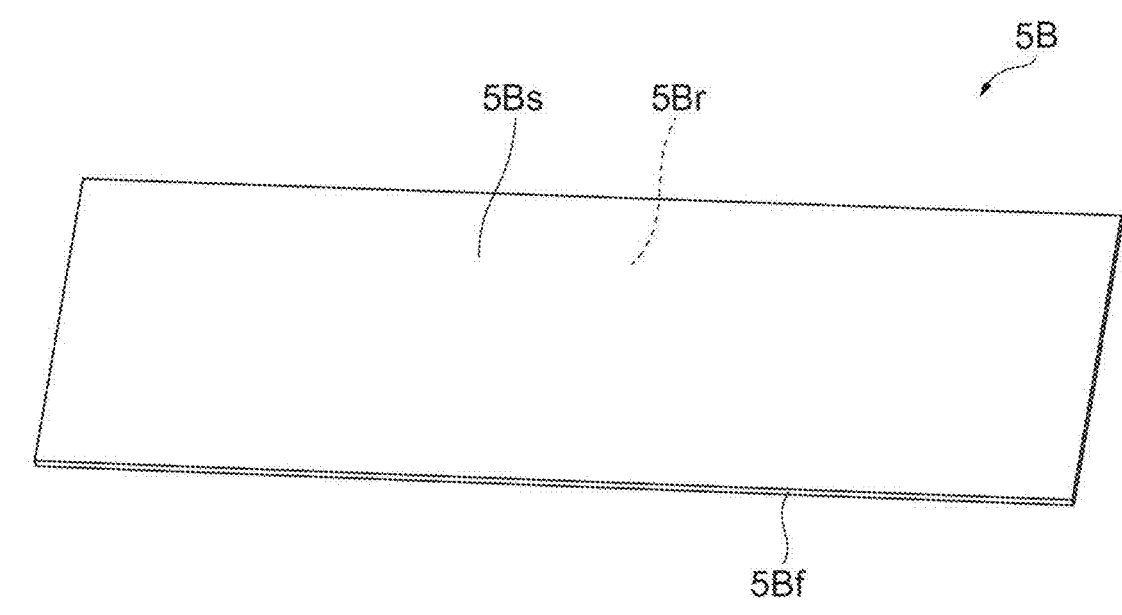
Figure 6:
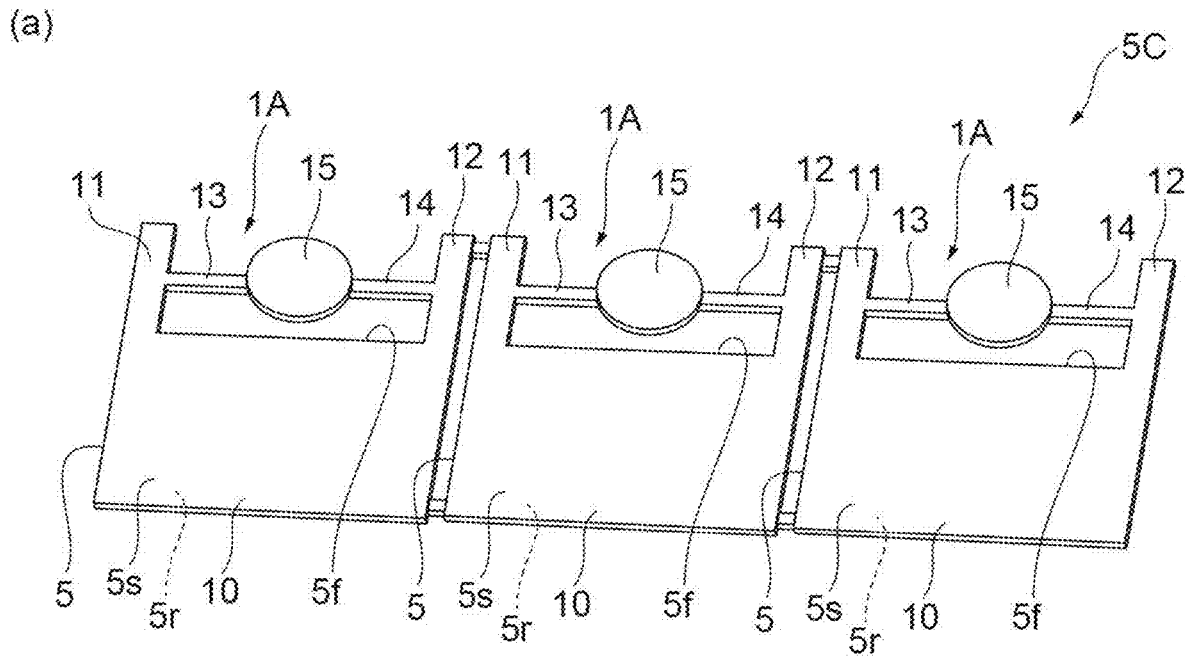
FIG. 6 is a perspective view illustrating a process of the method for manufacturing the optical unit illustrated in FIGS. 3 and 4.
Figure 6:
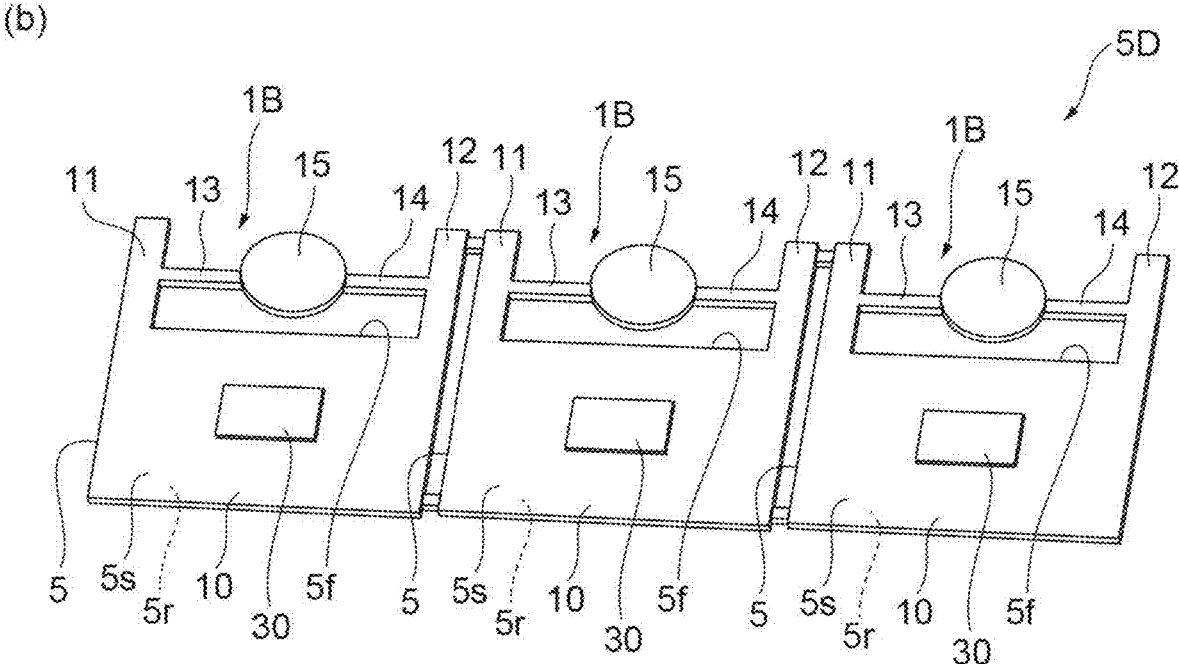
Figure 7:
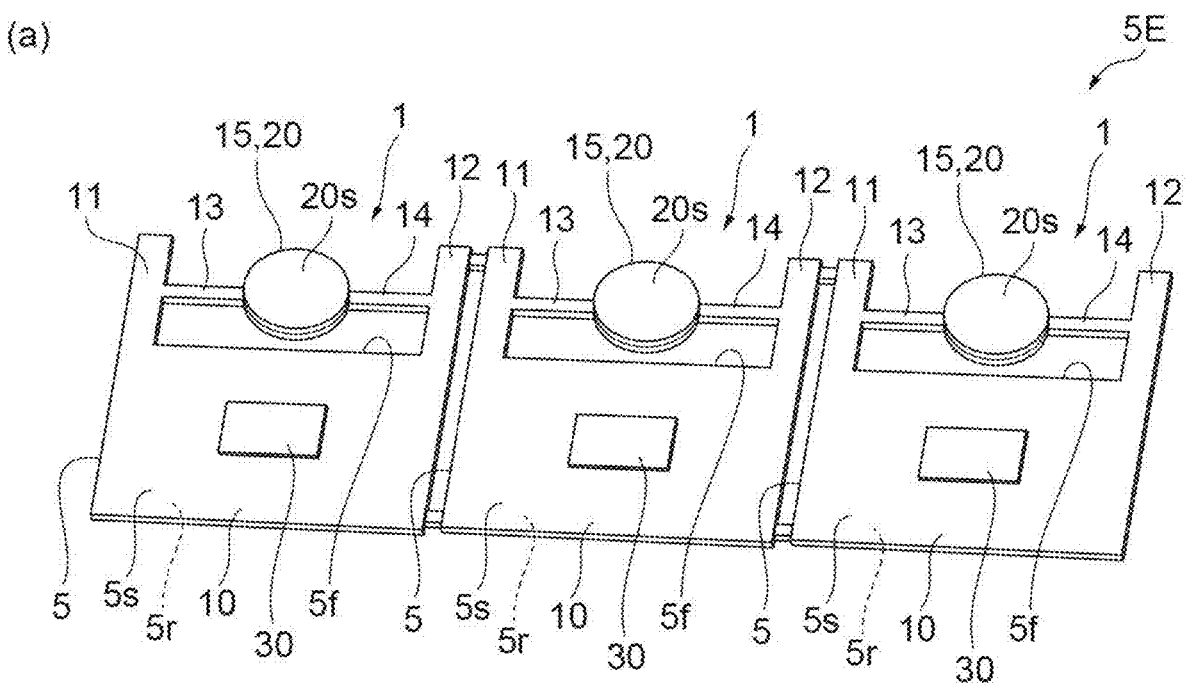
FIG. 7 is a perspective view illustrating a process of the method for manufacturing the optical unit illustrated in FIGS. 3 and 4.
Figure 7:
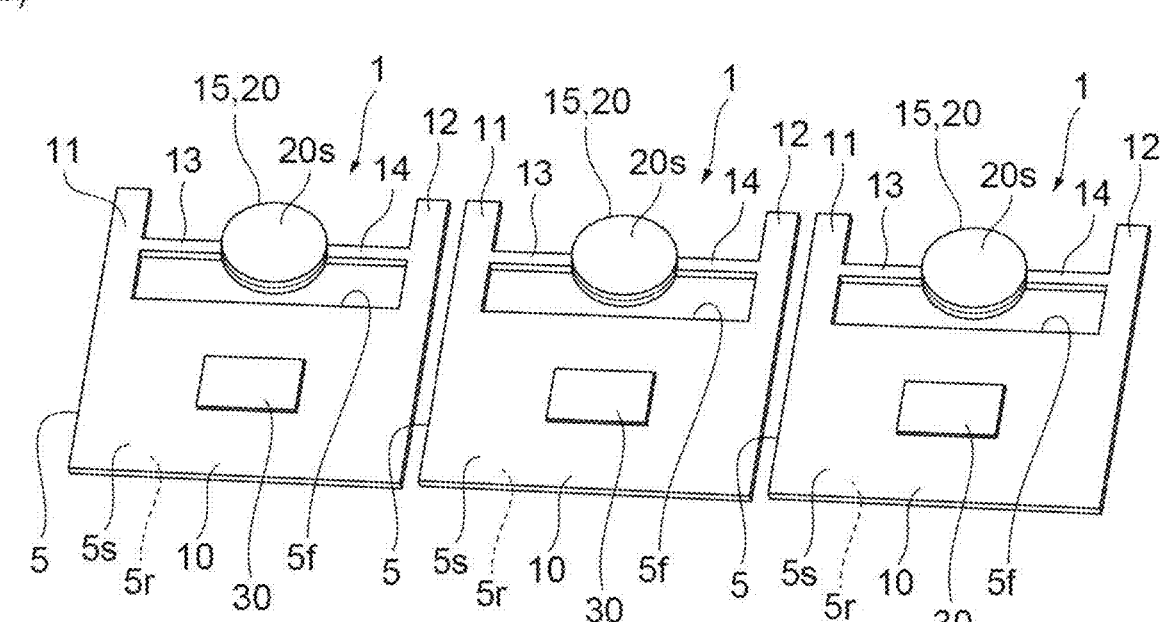

Subsequently, a method for manufacturing the above-mentioned optical unit 1 will be described. FIGS. 5 to 7 are perspective views each illustrating a process of a method for manufacturing the optical unit 1 illustrated in FIGS. 3 and 4. In this manufacturing method, first, as illustrated in FIG. 5(a), a rectangular plate-shaped metal plate (metal member) 5A is prepared (first process). The metal plate 5A has a main surface 5As, a back surface 5Ar on the opposite side from the main surface 5As, and a side surface 5Af connecting the main surface 5As and the back surface 5Ar to each other.

Subsequently, as illustrated in FIG. 5(b), a metal plate 5B is formed by roughening at least a part of a surface (the main surface 5As, the back surface 5Ar, and the side surface 5Af) of the metal plate 5A (second process). Here, as an example, the metal plate 5B is formed by roughening the entire surface of the metal plate 5A. The metal plate 5B has a main surface 5Bs, a back surface 5Br, and a side surface 5Bf, which are roughened. Examples of a roughening method include laser ablation, etching, or mechanical polishing. Here, since the entire surface of the metal plate 5A is collectively roughened, a method of immersing the entire metal plate 5A in an etching solution to perform etching may be used as the roughening method (other methods may be used). Note that roughening mentioned here means forming the above-mentioned matte surface.

Subsequently, as illustrated in FIG. 6(a), a metal plate 5C including a plurality of (here, three) bases 5 is formed by removing (cutting) a part of the metal plate 5B (third process). Each of the bases 5 is a portion 1A that becomes the optical unit 1 later. As a method for removing the part of the metal plate 5B, it is possible to use pressing or etching. The base 5 includes the main surface 5s and the back surface 5r, which are roughened (that is, on which the matte surface is formed) and the partially roughened side surface 5f. On the side surface 5f, a region, which has been the side surface 5Bf of the metal plate 5B, is roughened to have the matte surface formed thereon, and a region newly formed in this third process is not roughened and becomes a flat surface.

That is, in the optical unit 1 manufactured by this manufacturing method, at least a part of the side surface 5f becomes the flat surface. The region of the side surface 5f becoming the flat surface is a region of the support portion 10 facing the movable portion 15, a region of the first extending portion 11 and the second extending portion 12 facing each other, a region corresponding to both side surfaces of the first connecting portion 13 and the second connecting portion 14, and a region corresponding to an outer surface of the movable portion 15.

Note that the order of the second process and the third process may be changed. In this case, after removing a part of the metal plate 5A to form the metal plate 5C including the plurality of bases 5 from the metal plate 5A, at least a part of the surface of the metal plate 5C is roughened. At this time, when the entire surface of the metal plate 5C is roughened at once, the entire side surface 5f of the base 5 is roughened. That is, in the optical unit 1 manufactured in this case, a matte surface is formed on the entire side surface 5f. On the other hand, when a part of the surface of the metal plate 5C is roughened, it is possible to selectively roughen at least a part of at least one of the first region R1, the second region R2, and the third region R3 on the main surface 5s of the base 5. As a method of selective roughening, for example, laser ablation may be used.

In a subsequent process, as illustrated in FIG. 6(b), the vibrating element 30 (and the upper electrode 31 and the lower electrode 32) is formed on the support portion 10 of each base 5 (fourth process). As a result, a plate member 5D including a plurality of units 1B, each of which has the base 5 and the vibrating element 30, is formed. When the vibrating element 30 is a piezoelectric body, as a method for forming the piezoelectric body, for example, it is possible to use a printing method, pasting of a piezoelectric body chip, film formation and patterning by a vapor phase growth method, or film formation and patterning by a liquid phase growth method.

Subsequently, as illustrated in FIG. 7(a), the optical surface 20s is provided on the movable portion 15 of each base 5 (fifth process). Here, the optical surface 20s is provided on the movable portion 15 by attaching the optical member 20 including the optical surface 20s to the movable portion 15. As a result, a plate member 5E including a plurality of optical units 1 is formed. Note that the order of the fourth process and the fifth process may be changed.

Thereafter, as illustrated in FIG. 7(b), the individual optical units 1 are obtained by cutting off the respective optical units 1 (sixth process). Note that the order of the fifth process and the sixth process may be changed. Further, in the above manufacturing method, a description has been given of the method of manufacturing the plurality of optical units 1 at once. However, the optical units 1 may be manufactured one by one. In this case, the sixth process becomes unnecessary.

As described above, in the optical unit 1, the vibrating element 30 provided on the support portion 10 of the base 5 vibrates the support portion 10 to induce twisting vibration in the first connecting portion 13 and the second connecting portion 14 of the base 5, and the movable portion 15 provided with the optical surface 20s is oscillated. Therefore, various optical functions such as optical scanning may be realized by causing light to enter the optical surface 20s that oscillates through the movable portion 15. In particular, in the optical unit 1, the matte surface is formed on at least a part of at least any one of the first region R1 on the movable portion 15 side of the position where the vibrating element 30 is provided in the support portion 10 on the main surface 5s of the base 5 provided with the optical surface 20s, the second region R2 corresponding to the first extending portion 11 and the second extending portion 12, and the third region R3 facing the vibrating element 30 on the main surface 5s.

The first region R1 and the second region R2 are regions of the main surface 5s, which are relatively close to the optical surface 20s (movable portion 15) and easily entered by light. Therefore, when the matte surface is formed on the first region R1 and/or the second region R2, generation of stray light is suppressed. That is, the optical characteristics are improved. Further, when the matte surface is formed on the third region R3, adhesion of the vibrating element 30 (a layer contributing to adhesion of the vibrating element 30) to the third region R3 is improved, and bonding of the vibrating element 30 to the main surface 5s is strengthened. By firmly bonding the vibrating element 30 to the main surface 5s, it is possible to reliably induce twisting vibration in the first connecting portion 13 and the second connecting portion 14 in response to vibration of the vibrating element 30, thereby oscillating the optical surface 20s (movable portion 15). Therefore, even in this case, the optical characteristics are improved.

Note that in the optical unit 1, the base 5 is made of metal. Therefore, from a viewpoint of maintaining the strength of the base 5 and suppressing rusting of the base 5, it is considered desirable to set the surface of the base 5 as a flat surface. On the other hand, in the optical unit 1, as described above, from a viewpoint of improving the optical characteristics, the matte surface is formed on the surface of the base 5.

Further, in the optical unit 1, the vibrating element 30 is provided on the main surface 5s, and the matte surface is formed on the first region R1, the second region R2, and the third region R3. Therefore, the optical characteristics are reliably improved. Further, in the optical unit 1, since the matte surface is formed on the entire main surface 5s, the optical characteristics are more reliably improved. Further, in this case, when the matte surface is formed, the entire main surface 5s may be roughened at once, which facilitates manufacturing. Further, in the optical unit 1, since the matte surface is formed on at least a part of the side surface 5f, stray light is suppressed from being generated on the side surface 5f, and the optical characteristics are more reliably improved.

Note that, in the above-mentioned manufacturing method, when the order of the second process and the third process is changed to form the metal plate 5C including the plurality of bases 5, and then roughen the surface of the metal plate 5C, and when the entire surface of the metal plate 5C is roughened at once, the entire side surface 5f of the base 5 is roughened. In this case, in the optical unit 1, the matte surface is formed on the entire side surface 5f. Therefore, in this case, the optical characteristics may be more reliably improved.

Further, according to the above-mentioned method for manufacturing the optical unit 1, it is possible to manufacture the optical unit 1 having improved optical characteristics for a similar reason.

The embodiment has been described as an example of the present disclosure. Therefore, the present disclosure is not limited to the example described above, and various modifications may be made. Subsequently, modifications will be described.

[First Modification of Optical Unit]

Figure 8:
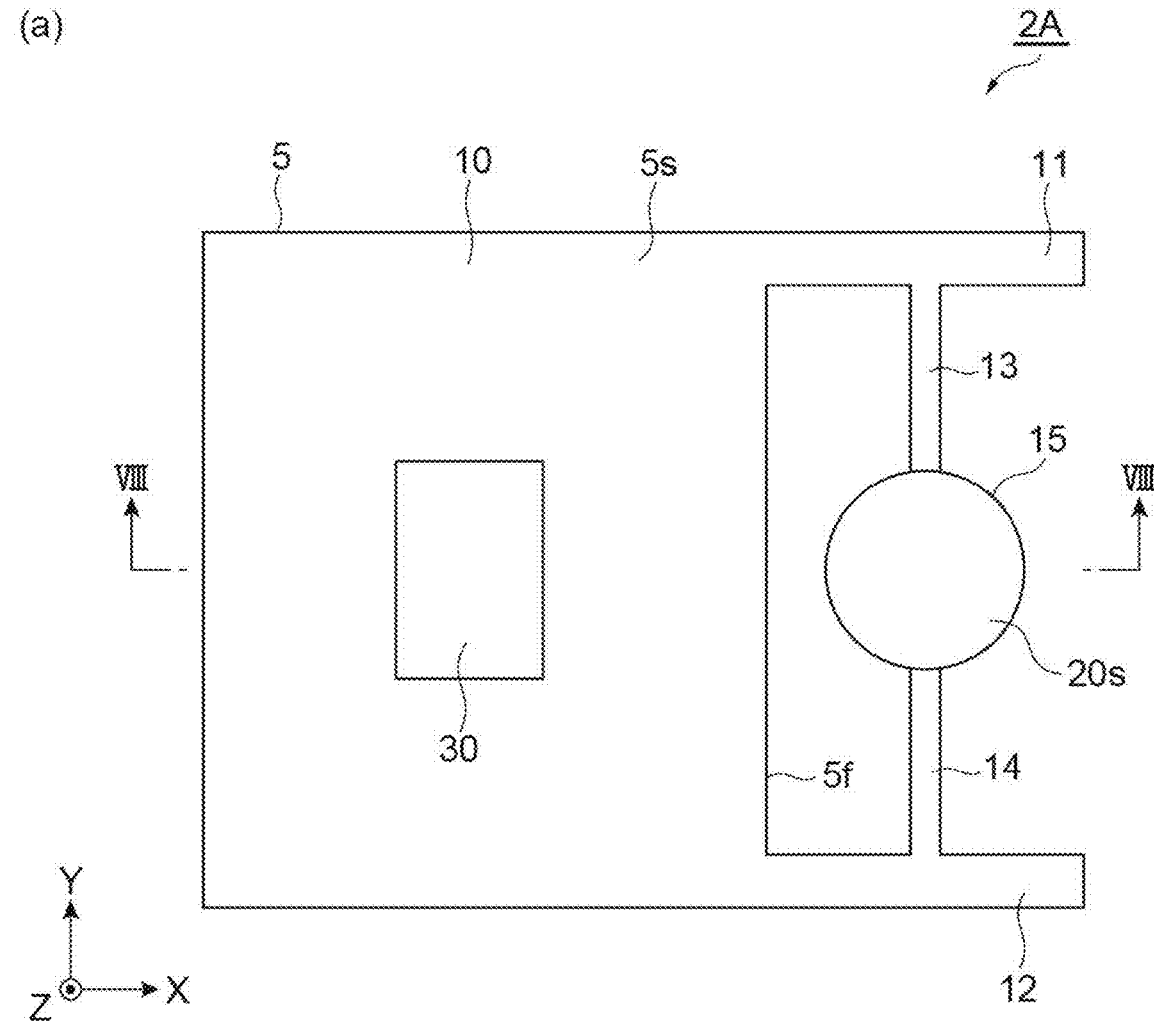
FIG. 8 is a diagram illustrating an optical unit according to a first modification.
Figure 8:
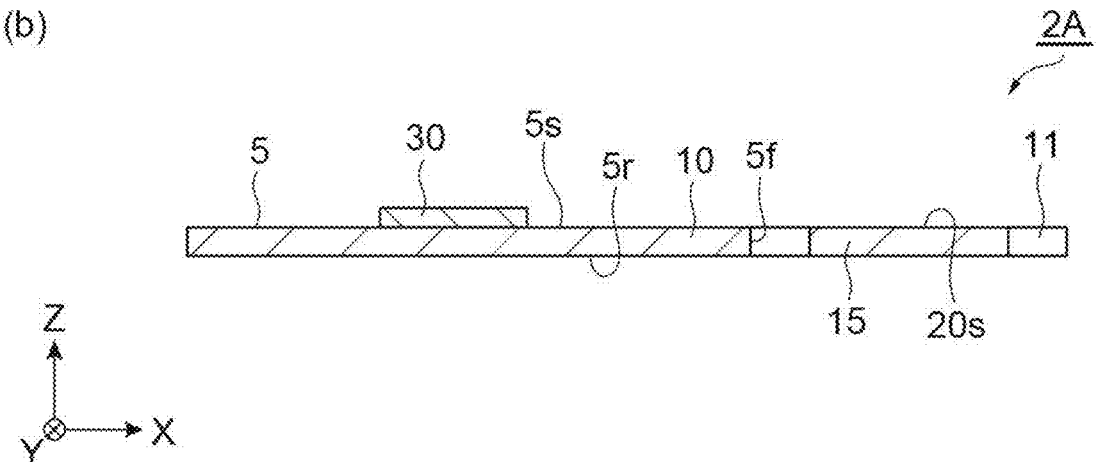

FIG. 8 is a diagram illustrating an optical unit according to a first modification. FIG. 8(a) is a plan view, and FIG. 8(b) is a cross-sectional view taken along the line VIII-VIII. As illustrated in FIG. 8, the optical unit 2A according to the first modification is different from the optical unit 1 in that the optical member 20 is not provided, and is the same as the optical unit 1 in other respects.

In the optical unit 2A, the optical surface 20s is directly provided on a main surface 5s in a movable portion 15s. The optical surface 20s is directly formed on the main surface 5s as a mirror surface (reflective surface) by, for example, forming the main surface 5s in the movable portion 15s as a mirror surface. In other words, in the optical unit 2A, a region of the main surface 5s corresponding to the movable portion 15s is the optical surface 20s. As an example, the optical unit 2A may be manufactured as follows.

Figure 9:
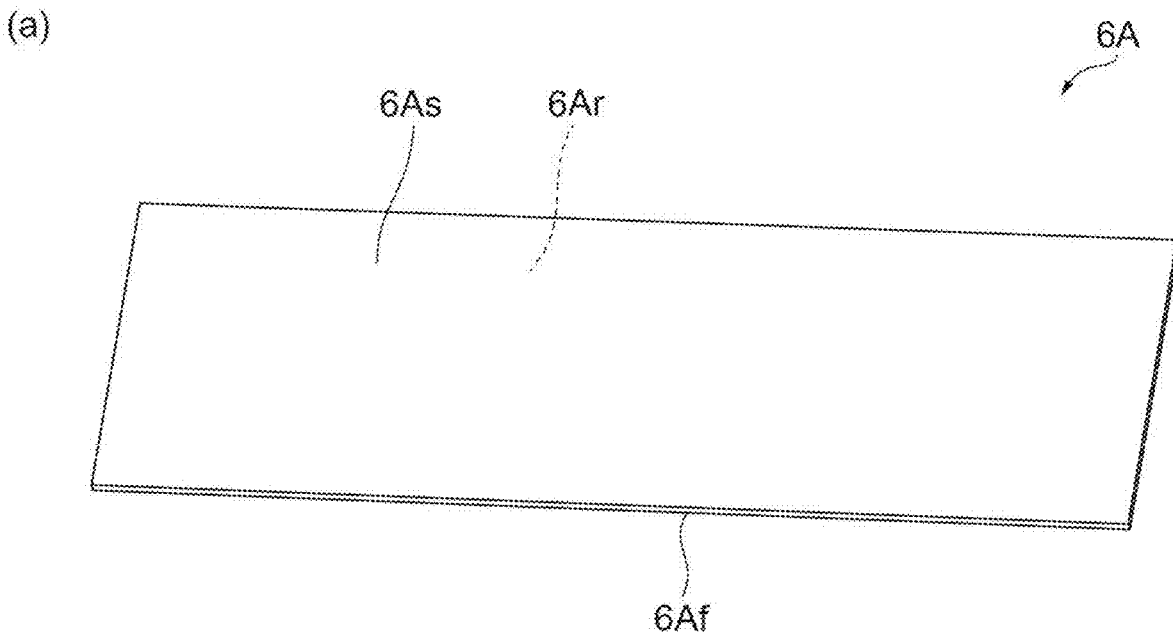
FIG. 9 is a perspective view illustrating a process of a method for manufacturing the optical unit illustrated in FIG. 8.
Figure 9:
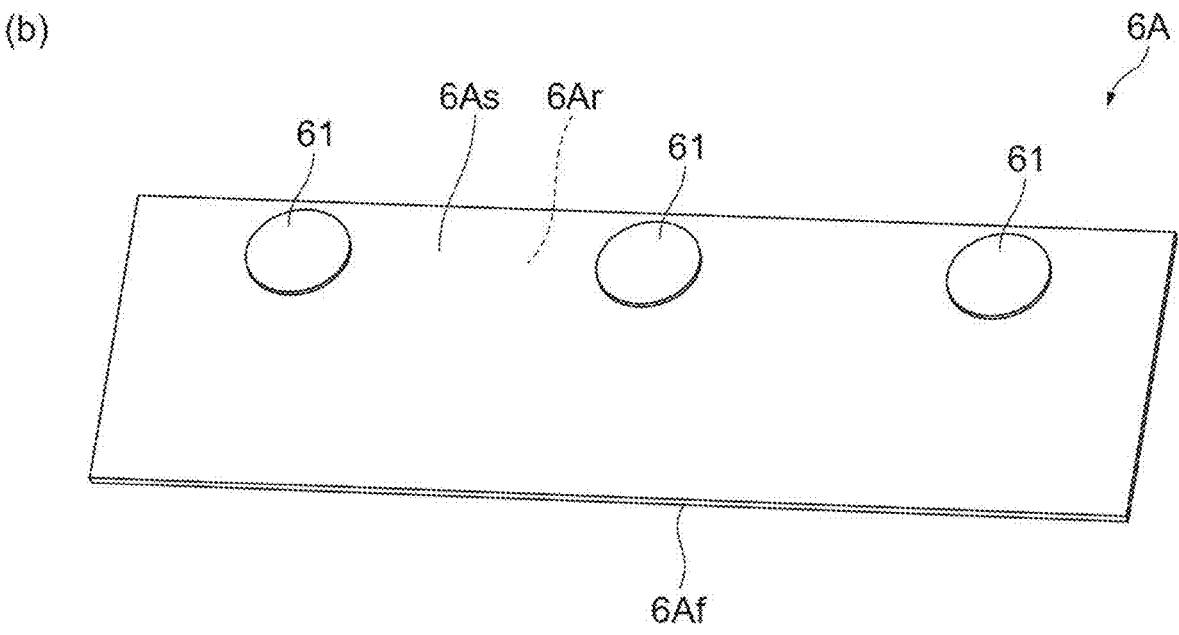
Figure 10:
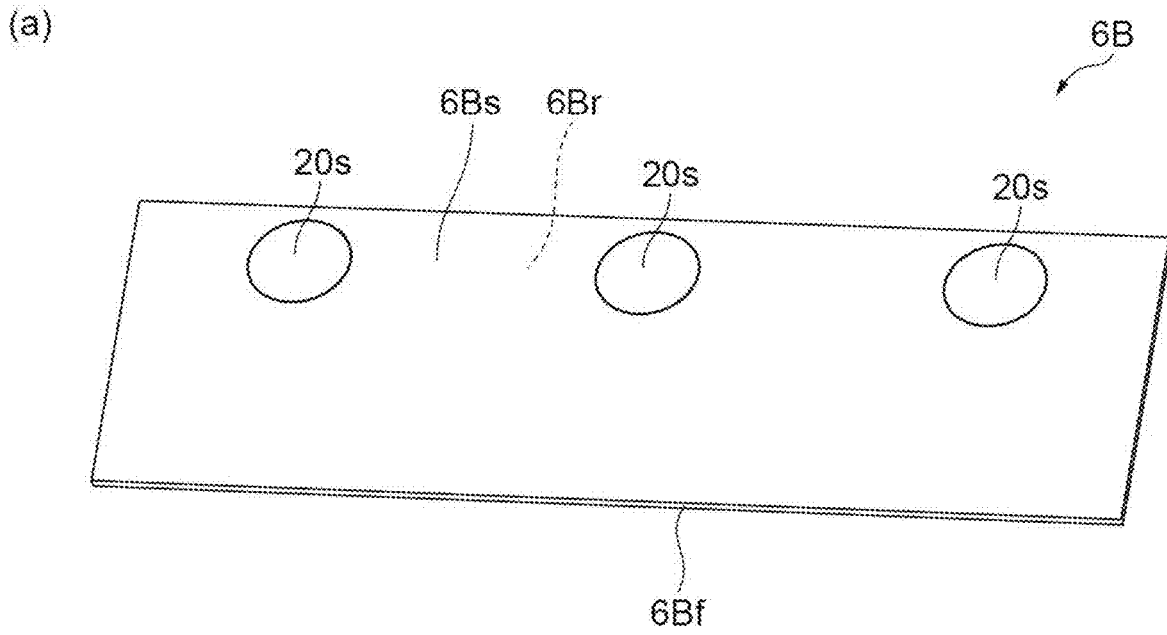
FIG. 10 is a perspective view illustrating a process of the method for manufacturing the optical unit illustrated in FIG. 8.
Figure 10:
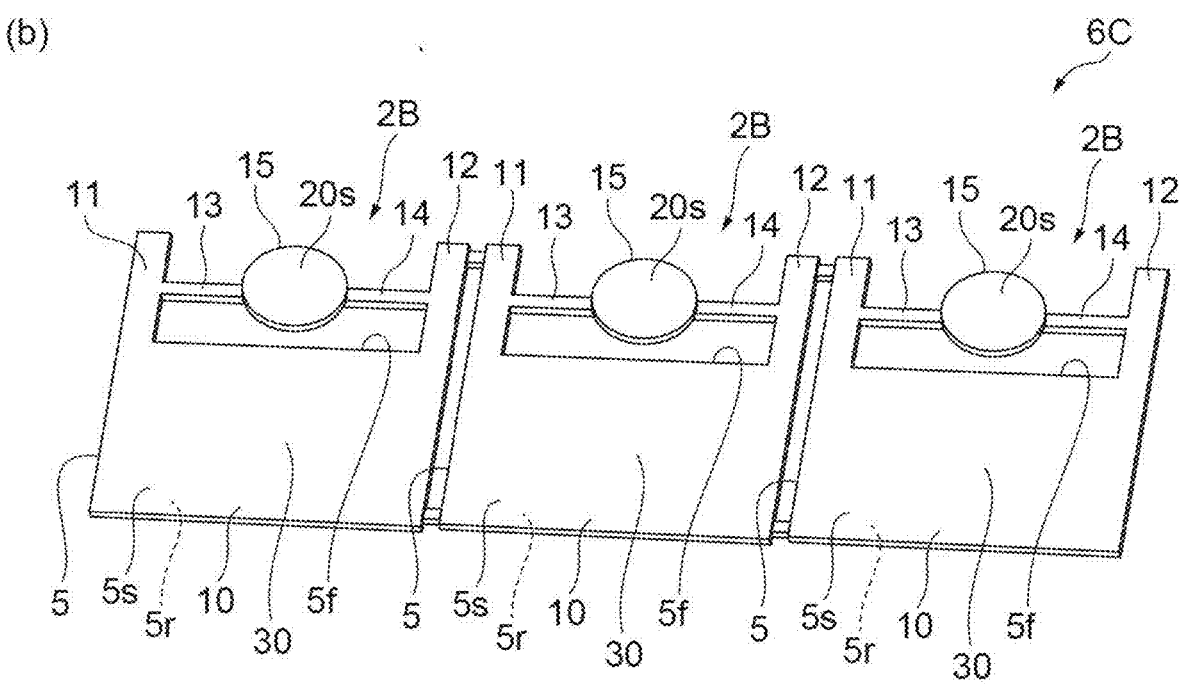
Figure 11:
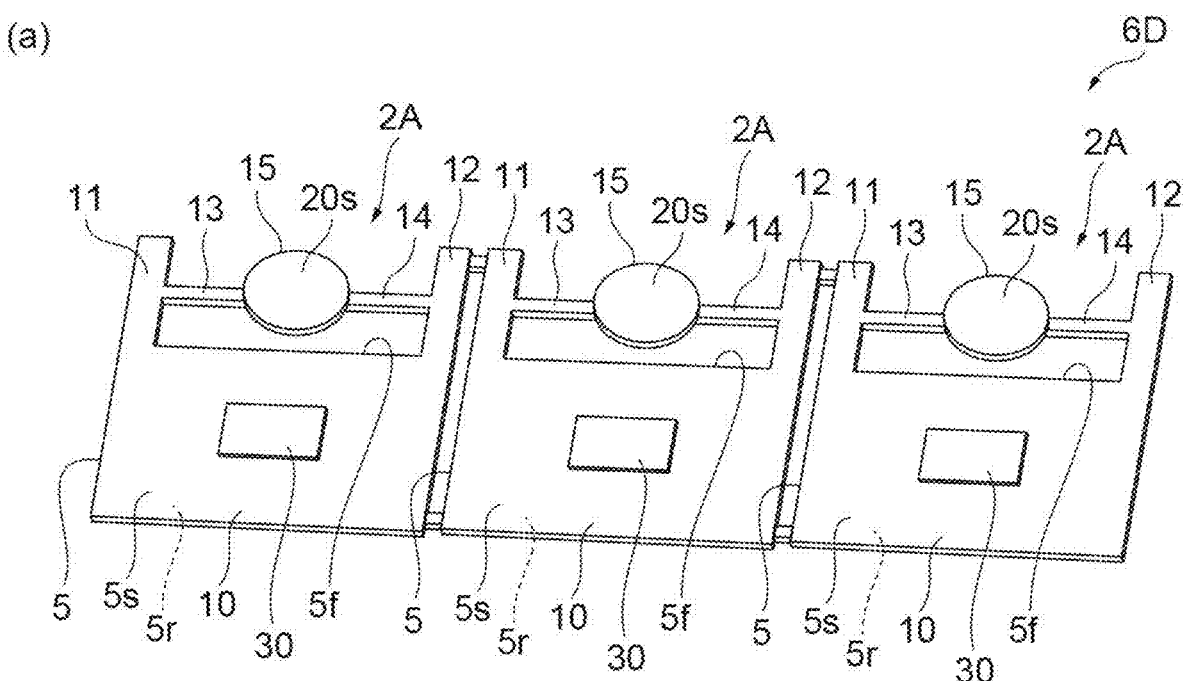
FIG. 11 is a perspective view illustrating a process of the method for manufacturing the optical unit illustrated in FIG. 8.
Figure 11:
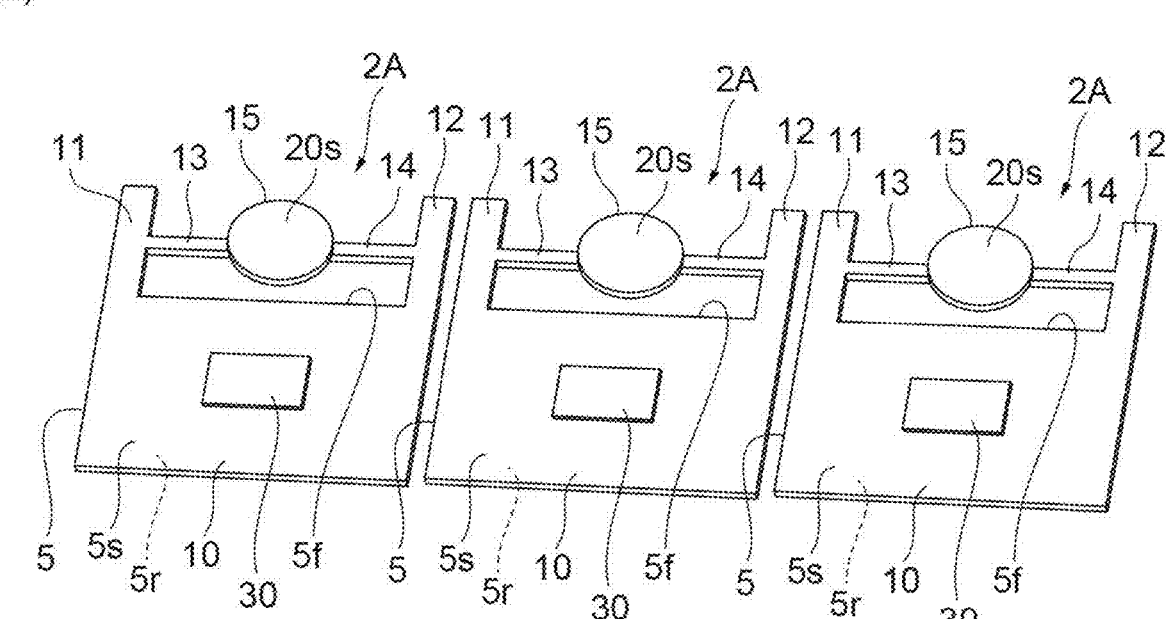

FIGS. 9 to 11 are perspective views each illustrating a process of a method for manufacturing the optical unit illustrated in FIG. 8. In the method for manufacturing the optical unit 2A, first, as illustrated in FIG. 9(a), a metal plate (metal member) 6A is prepared (first process). The metal plate 6A has a main surface 6As, a back surface 6Ar on the opposite side from the main surface 6As, and a side surface 6Af connecting the main surface 6As and the back surface 6Ar to each other. On a surface of the metal plate 6A, at least the main surface 6As is a mirror surface. That is, in the first process, the metal plate 6A, in which at least the main surface 6As is a mirror surface, is prepared.

Subsequently, as illustrated in FIG. 9(b), after forming a mask 61 on the main surface 6As, the surface of the metal plate 6A is roughened to form a metal plate 6B having a main surface 6Bs, a back surface 6Br, and a side surface 6Bf, which are roughened, (second process). Here, the mask 61 is provided in a region becoming the movable portion 15 later. As a result, in the metal plate 6B, a mirror surface remains in the region where the mask 61 is provided, and the optical surface 20s is formed.

Subsequently, as illustrated in FIG. 10(b), a part of the metal plate 6B is removed (cut) to form a metal plate 6C including a plurality of (here, three) units 2B, each of which has a base 5 and the optical surface 20s (third process). The base 5 includes the main surface 5*s* and the back surface 5*r*, which are roughened (that is, on which the matte surface is formed) and the partially roughened side surface 5*f*. On the side surface 5*f*, a region, which has been the side surface 6B*f* of the metal plate 6B, is roughened, and a region newly formed in this third process is not roughened.

Note that the order of the second process and the third process may be changed. In this case, after removing a part of the metal plate 6A to form the metal plate 6C including the plurality of bases 5, a mask 61 is provided on the metal plate 6C to roughen the surface. In a subsequent process, as illustrated in FIG. 11(*a*), a vibrating element 30 (and an upper electrode 31 and a lower electrode 32) is formed on the support portion 10 of each base 5 (fourth process). As a result, a plate member 6D including a plurality of optical units 2A is formed.

Thereafter, as illustrated in FIG. 11(*b*), the individual optical units 2A are obtained by cutting off the respective optical units 2A (sixth process). In the above manufacturing method, a description has been given of the method of manufacturing the plurality of optical units 2A at once. However, the optical units 2A may be manufactured one by one. In this case, the sixth process becomes unnecessary.

Similarly to the optical unit 1, the optical characteristics of the optical unit 2A described above are improved as a result of suppressing stray light by formation of the matte surface and strengthening bonding of the vibrating element 30. Further, in the optical unit 2A, since the optical surface 20*s* is directly formed on the main surface 5*s* in the movable portion 15*s*, it is unnecessary to prepare the optical member 20 configured separately from the base 5, and cost is reduced. Further, according to the optical unit 2A, warp of the optical surface 20*s* is suppressed when compared to the case where the optical member 20 is used.

[Second Modification of Optical Unit]

Figure 12:
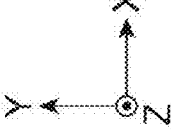
FIG. 12 is a plan view illustrating an optical unit according to a second modification.

FIG. 12 is a plan view illustrating an optical unit according to a second modification. As illustrated in FIG. 12, the optical unit 2C according to the second modification is different from the optical unit 1 in that a stress relaxation portion 16 is provided, and is the same as the optical unit 1 in other respects. The stress relaxation portion 16 is for relaxing stress caused by twist of the first connecting portion 13 and the second connecting portion 14. Therefore, the stress relaxation portion 16 is interposed between the optical surface 20*s* and the first connecting portion 13 and between the optical surface 20*s* and the second connecting portion 14.

More specifically, in the optical unit 2C, the movable portion 15 includes the stress relaxation portion 16 and an installation portion 17 provided with the optical surface 20*s*. That is, in the second modification, the stress relaxation portion 16 is formed on the base 5 as a part of the movable portion 15. The stress relaxation portion 16 includes a first portion 16*a* connected to the first connecting portion 13 and a second portion 16*b* connected to the second connecting portion 14. The first portion 16*a* extends from the first connecting portion 13 toward the second connecting portion 14 while branching in two directions, that is, to a positive side and a negative side in the X-axis direction. The second portion 16*b* extends from the second connecting portion 14 toward the first connecting portion 13 while extending in two directions, that is, to the positive side and the negative side in the X-axis direction.

The first portion 16*a* and the second portion 16*b* are connected to each other at an intermediate position between the first extending portion 11 and the second extending portion 12 in the Y-axis direction and are integrated to form an annular shape as a whole. Here, the first portion 16*a* and the second portion 16*b* each have an arc shape (semicircular shape), and are integrated with each other to form the annular shape. A width (dimension in a direction intersecting the Z-axis direction and the extending direction) of each of the first portion 16*a* and the second portion 16*b* is smaller than widths of the first connecting portion 13 and the second connecting portion 14, and a width of the installation portion 17.

The installation portion 17 extends along the X-axis direction (here linearly) so as to bridge over a pair of connecting portions which connect the first portion 16*a* and the second portion 16*b*. Here, the optical surface 20*s* is provided on the installation portion 17 by attaching the optical member 20 to the installation portion 17. However, the optical surface 20*s* may be provided directly on the installation portion 17 by forming the main surface 5*s* as a mirror surface on the installation portion 17.

Similarly to the optical unit 1, the optical characteristics of the optical unit 2C described above are improved as a result of suppressing stray light by formation of the matte surface and strengthening bonding of the vibrating element 30. Further, in the optical unit 2C, a transmission path of stress caused by twist of the first connecting portion 13 is divided in the first portion 16*a* branching in two directions in the stress relaxation portion 16, and a transmission path of stress caused by twist of the second connecting portion 14 is similarly divided in the second portion 16*b* branching in two directions. Further, since the widths of the first portion 16*a* and the second portion 16*b* of the stress relaxation portion 16 are relatively small, the stress relaxation portion 16 is preferentially deformed. As a result, stress caused by twist of the first connecting portion 13 and the second connecting portion 14 is relaxed in the stress relaxation portion 16, and the optical surface 20*s* is inhibited from bending through the installation portion 17. Therefore, the optical characteristics are further improved.

Here, in the stress relaxation portion 16 and the installation portion 17 (that is, the movable portion 15), a flat surface may be formed without forming a matte surface on the side surface 5*f*. In the optical unit 2C, since the stress relaxation portion 16 is provided in the movable portion 15, the area of a region corresponding to the movable portion 15 on the side surface 5*f* becomes large. Therefore, by forming a flat surface in the region corresponding to the movable portion 15 on the side surface 5*f*, the effect of suppressing a decrease in strength is relatively large. Further, in this case, when compared to the case where the matte surface is formed on the region corresponding to the movable portion 15 on the side surface 5*f*, it is possible to form a structure closer to a design value, and it is possible to stabilize the operation of the movable portion 15, and stabilize the optical characteristics.

Figure 13:
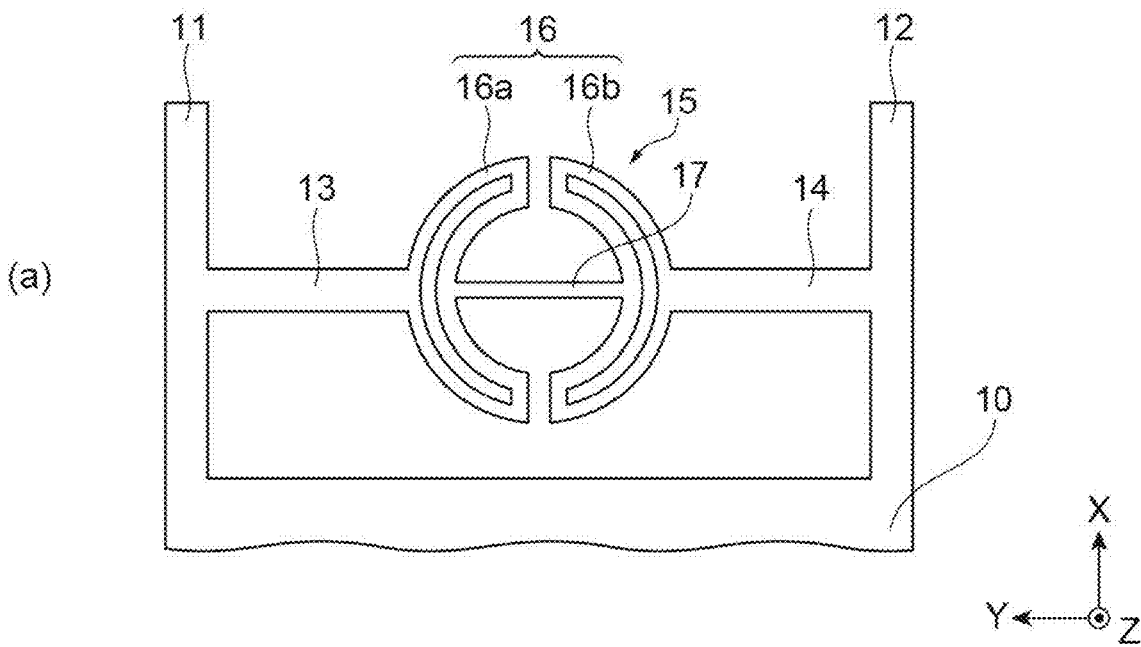
FIG. 13 is a plan view illustrating modifications of a stress relaxation portion and an installation portion illustrated in FIG. 12.
Figure 13:
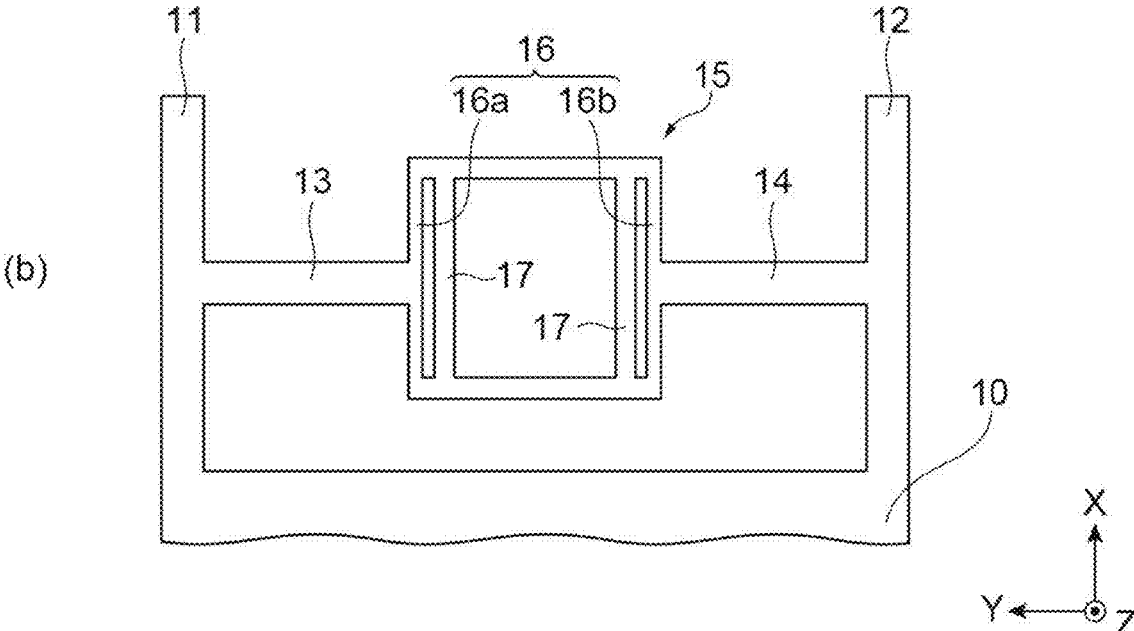

Note that shapes of the stress relaxation portion 16 and the installation portion 17 are not limited to the above examples. As an example, as illustrated in FIG. 13(*a*), the installation portion 17 may be provided so as to extend along the Y-axis direction. In this case, the first portion 16*a* and the second portion 16*b* of the stress relaxation portion 16 are formed in an annular shape by branching from the first connecting portion 13 and the second connecting portion 14 respectively in two directions of the positive side and the negative side in the X-axis direction, and extending so that branching portions are reconnected to each other. Then, the installation portion 17 extends linearly along the Y-axis direction so as to bridge over the first portion 16*a* and the second portion 16*b*. In this case, the first portion 16*a* and the second portion 16*b* are connected through the installation portion 17.

Further, as another example, as illustrated in FIG. 13 (*b*), a plurality of (here, two) installation portions 17 may be provided. Here, a pair of installation portions 17 extends along the X-axis direction in a state of being separated from each other. In this case, the first portion 16*a* and the second portion 16*b* of the stress relaxation portion 16 have portions extending along the X-axis direction (linearly) while branching in two directions of the positive side and the negative side in the X-axis direction, from the first connecting portion 13 and the second connecting portion 14 respectively, and each have portions extending along the Y-axis direction (linearly) from ends of the portion. The first portion 16*a* and the second portion 16*b* are connected and integrated with each other at portions extending along the Y-axis direction, and have an annular shape (here, a rectangular annular shape) as a whole. Further, the installation portion 17 extends linearly along the X-axis direction so as to bridge over the first portion 16*a* and the second portion 16*b*.

Further, in the above example, a description has been given of an example in which each of the first portion 16*a* and the second portion 16*b* of the stress relaxation portion 16 branches in two directions from each of the first connecting portion 13 and the second connecting portion 14. However, the first portion 16*a* and the second portion 16*b* may be configured to branch from the first connecting portion 13 and the second connecting portion 14 respectively in a plurality of directions, in more detail, in three or more directions. That is, here, the stress relaxation portion 16 is a portion which branches into a plurality of parts and is provided integrally with the base 5 between the optical surface 20*s* and the first connecting portion 13 and between the optical surface 20*s* and the second connecting portion 14.

[Third Modification of Optical Unit]

Figure 14:
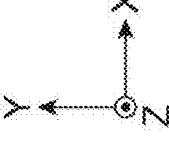
FIG. 14 is a plan view illustrating an optical unit according to a third modification.

FIG. 14 is a plan view illustrating an optical unit according to a third modification. As illustrated in FIG. 14, when compared to the optical unit 1, the optical unit 2D according to the third modification is different from the optical unit 1 in that a stress relaxation portion 21 is provided and in a shape of the movable portion 15, and is the same as the optical unit 1 in other respects. The stress relaxation portion 21 is for relaxing stress caused by twist of the first connecting portion 13 and the second connecting portion 14, as in the second modification. Therefore, the stress relaxation portion 21 is interposed between the optical surface 20*s* and the first connecting portion 13 and between the optical surface 20*s* and the second connecting portion 14, as in the second modification.

However, in the third modification, the stress relaxation portion 21 is integrally formed with the optical member 20. That is, the stress relaxation portion 21 is provided in an annular shape (here, a circular ring shape) around the optical member 20 to surround the optical member 20 when viewed in the Z-axis direction. A more specific description will be given. Here, the first connecting portion 13 and the second connecting portion 14 are connected to each other at center positions of the first extending portion 11 and the second extending portion 12 in the Y-axis direction, and the movable portion 15 extends (linearly) on both sides in the X-axis direction from a connecting portion between the first extending portion 11 and the second extending portion 12.

Further, the stress relaxation portion 21 includes a first portion 21*a* fixed to a portion on one side of the movable portion 15 in the X-axis direction and a second portion 21*b* fixed to a portion on the other side of the movable portion 15 in the X-axis direction. The first portion 21*a* extends along the X-axis direction while branching from a fixed portion 22*a* fixed to the movable portion 15 in two directions, that is, to the positive side and the negative side in the Y-axis direction. The second portion 21*b* extends along the X-axis direction while branching from a fixed portion 22*b* fixed to the movable portion 15 in two directions, that is, to the positive side and the negative side in the Y-axis direction. The first portion 21*a* and the second portion 21*b* are connected and integrated with each other at positions overlapping the first connecting portion 13 and the second connecting portion 14, respectively, when viewed in the Z-axis direction, and have an annular shape as a whole.

Here, the first portion 21*a* and the second portion 21*b* each have an arc shape (semicircular shape), and are integrated with each other to form an annular shape. A width of each of the first portion 21*a* and the second portion 21*b* (dimension in a direction intersecting the Z-axis direction and the extending direction) is smaller than the widths of the first connecting portion 13 and the second connecting portion 14, and a width of the movable portion 15. The optical member 20 and the stress relaxation portion 21 are connected and integrated with each other by a pair of connecting portions 23 provided at connecting portion between the first portion 21*a* and the second portion 21*b* (integrally formed of the same material as that of the optical member 20). Meanwhile, the optical member 20 and the stress relaxation portion 21 are separated from each other at a portion other than the connecting portions 23, and a space is formed therebetween. Note that the optical surface 20*s* is separated from the movable portion 15 in the Z-axis direction.

Similarly to the optical unit 1, the optical characteristics of the optical unit 2D described above are improved as a result of suppressing stray light by formation of the matte surface and strengthening bonding of the vibrating element 30. Further, in the optical unit 2D, a transmission path of stress caused by twist of the first connecting portion 13 and the second connecting portion 14 is divided in the first portion 21*a* branching in two directions from the fixed portion 22*a* fixed to the movable portion 15, and is divided in the second portion 21*b* branching in two directions from the fixed portion 22*b* fixed to the movable portion 15. Further, since the widths of the first portion 21*a* and the second portion 21*b* of the stress relaxation portion 21 are relatively small, the stress relaxation portion 21 is preferentially deformed. As a result, stress caused by twist of the first connecting portion 13 and the second connecting portion 14 is relaxed in the stress relaxation portion 21, and the optical surface 20*s* is inhibited from bending. Therefore, the optical characteristics are further improved.

In the above example, a description has been given of an example in which each of the first portion 21*a* and the second portion 21*b* of the stress relaxation portion 21 branches in two directions from each of the fixed portions 22*a* and 22*b* fixed to the movable portion 15. However, the first portion 21*a* and the second portion 21*b* may be configured to branch from the fixed portions 22*a* and 22*b*, respectively, in a plurality of directions, in more detail, in three or more directions. That is, here, the stress relaxation portion 21 is a portion which branches into a plurality of parts and is provided integrally with the optical member 20 between the optical surface 20*s* and the first connecting portion 13 and between the optical surface 20*s* and the second connecting portion 14 (separately from the base 5).

[Fourth Modification of Optical Unit]

Figure 15:
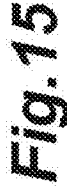
FIG. 15 is a plan view illustrating an optical unit according to a fourth modification.

FIG. 15 is a plan view illustrating an optical unit according to a fourth modification. As illustrated in FIG. 15, when compared to the optical unit 1, the optical unit 2E according to the fourth modification is different from the optical unit 1 in that an optical member 60 is provided instead of the optical member 20 and in a shape of the movable portion 15, and is the same as the optical unit 1 in other respects.

Here, an opening 15p is formed in the movable portion 15. Here, the movable portion 15 has a circular ring shape in which the opening 15p having a circular shape is formed. However, the movable portion 15 may have another shape. The optical member 60 is attached to the movable portion 15, for example, so that a center thereof coincides with a center of the opening 15p. More specifically, the optical member 60 is formed in a disc shape as an example, and includes an optical surface 60s and an optical surface 60r on the opposite side from the optical surface 60s. The optical member 60 is attached to the movable portion 15 so that the optical surface 60r faces the main surface 5s, that is, the optical surface 60s faces a side opposite to the main surface 5s. Therefore, in the optical unit 2E, a pair of the optical surfaces 60s and 60r is provided on the main surface 5s in the movable portion 15. The optical member 60 is made of a material that transmits light.

Such an optical member 60 may be configured as a spectroscopic filter as an example. In this case, an antireflection film is formed on the optical surface 60s, which is an incident surface of light, and a spectroscopic filter is formed on the optical surface 60r, which is an emitting surface of light, so that the optical unit 2E may be configured as a spectroscopic element in which a wavelength of transmitted light varies depending on the angle of oscillation of the movable portion 15.

By using such a spectroscopic element, it is possible to configure a spectroscopic device that detects light, which is emitted from a light source and transmitted or reflected by an object to be measured, using a photodetector through a spectroscopic element (or by further reflecting and separating the light using the spectroscopic element). Alternatively, by disposing such a spectroscopic element together with a laser medium inside an optical resonator, it is possible to configure a wavelength-variable light source that outputs light transmitted through the spectroscopic element and amplified by the optical resonator. Note that a transmission type grating (or a reflection type grating) may be used instead of the spectroscopic filter. Further, the optical unit 2E may be configured as an optical path changer by using the optical member 60 as a transmission refraction element.

Similarly to the optical unit 1, the optical characteristics of the optical unit 2E configured as a transmission type optical unit are improved as a result of suppressing stray light by formation of the matte surface and strengthening bonding of the vibrating element 30.

[Fifth Modification of Optical Unit]

Figure 16:
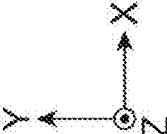
FIG. 16 is a plan view illustrating an optical unit according to a fifth modification.
Figure 17:
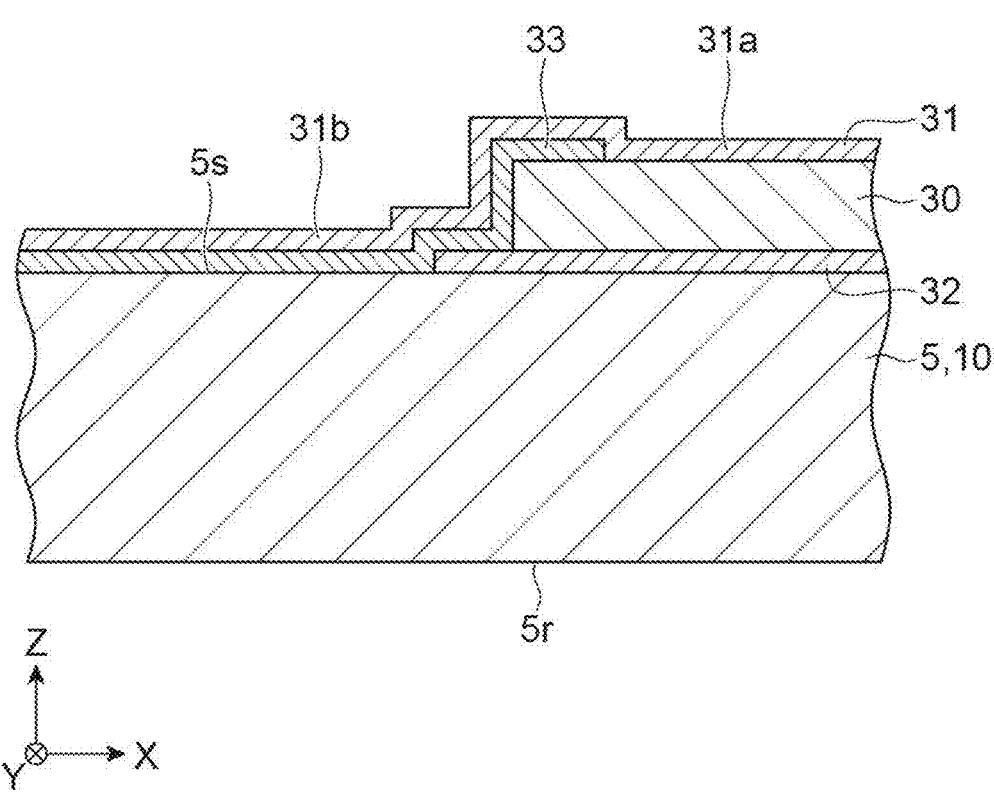
FIG. 17 is a cross-sectional view taken along the line VII-VII of FIG. 16.

FIG. 16 is a plan view illustrating an optical unit according to a fifth modification. FIG. 17 is a cross-sectional view taken along the line VII-VII of FIG. 16. As illustrated in FIGS. 16 and 17, when compared to the optical unit 1, the optical unit 2F according to the fifth modification is different from the optical unit 1 in an electrical connection structure of the vibrating element 30, and is the same as the optical unit 1 in other respects.

That is, in the optical unit 2F, the upper electrode 31 extends from the vibrating element 30 over the support portion 10. More specifically, the upper electrode 31 includes a first portion 31a, which is located on the support portion 10 and the vibrating element 30 and in contact with the vibrating element 30, and a second portion 31b provided on the support portion 10 so as to extend from the first portion 31a toward an outer edge of the support portion 10. An insulating layer 33 is interposed between the second portion 31b and the support portion 10 (main surface 5s).

The first portion 31a is a portion of the upper electrode 31 overlapping with the vibrating element 30 when viewed in the Z-axis direction. The second portion 31b is a portion (a portion protruding from the vibrating element 30) of the upper electrode 31 not overlapping with the vibrating element 30 when viewed in the Z-axis direction. When viewed in the Z-axis direction, a shortest distance between the second portion 31b and the outer edge of the support portion 10 is smaller than a shortest distance between the first portion 31a and the outer edge of the support portion 10.

Similarly to the optical unit 1, the optical characteristics of the optical unit 2F described above are improved as a result of suppressing stray light by formation of the matte surface and strengthening bonding of the vibrating element 30. Further, in the optical unit 2F, the vibrating element 30 may be electrically connected to the outside by providing wiring such as a wire (for example, wiring 41 of the optical device 100) in the second portion 31b extending toward the outer edge of the support portion 10. Therefore, when compared to the case where the wiring such as the wire is directly extended from the outside to the vibrating element 30, the wiring such as the wire is shortened and stable connection is possible. Note that the term "outside" mentioned here refers to a part other than the optical unit 2F. In an optical device (for example, the optical device 100) including the optical unit 2F, for example, the term "outside" may refer to a part inside the optical device on a substrate, etc. on which the optical unit 2F is mounted (for example, the wiring board 115, etc. of the optical device 100).

[Sixth Modification of Optical Unit]

Figure 18:
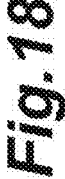
FIG. 18 is a plan view illustrating an optical unit according to a sixth modification.
Figure 18:
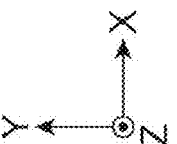

FIG. 18 is a plan view illustrating an optical unit according to a sixth modification. As illustrated in FIG. 18, when compared to the optical unit 1, the optical unit 2G according to the sixth modification is different from the optical unit 1 in an electrical connection structure of the vibrating element 30 according to a shape of the support portion 10, and is the same as the optical unit 1 in other respects.

That is, in the optical unit 2G, an opening 10p is formed in the support portion 10. The opening 10p is a through-hole that penetrates the base 5 in the support portion 10. The opening 10p is formed in the support portion 10 so that a shortest distance between an inner edge of the opening 10p and the outer edge of the support portion 10 is smaller than a shortest distance between the vibrating element 30 (upper electrode 31) and the outer edge of the support portion 10 when viewed in the Z-axis direction. The optical unit 2G is attached to the wiring board 115 so that the electrode 40 provided on the wiring board 115 is exposed from the opening 10p to the main surface 5s side. Further, the wiring 41 is connected to the electrode 40 and the vibrating element 30 (upper electrode 31) through the opening 10p.

Similarly to the optical unit 1, the optical characteristics of the optical unit 2G described above are improved as a result of suppressing stray light by formation of the matte surface and strengthening bonding of the vibrating element 30. Further, in the optical unit 2G, similarly to the optical unit 2F, the wiring 41 such as the wire is shortened, and stable connection is possible.

[Seventh Modification of Optical Unit]

Figure 19:
FIG. 19 is a plan view illustrating an optical unit according to a seventh modification.

FIG. 18 is a plan view illustrating an optical unit according to a seventh modification. As illustrated in FIG. 19, the optical unit 2H according to the seventh modification is different from the optical unit 1 in a formation range of the matte surface, and is the same as the optical unit 1 in other respects. In the optical unit 2H, a matte surface is formed on a portion of the base 5 exposed from the opening 112r provided in the lid 112 of the package 110. The portion of the base 5 exposed from the opening 112r refers to a portion of the base 5 including the movable portion 15 (that is, the optical surface 20s) and a portion located inside the opening 112r when viewed in the Z-axis direction.

Here, the matte surface is formed on an entire fourth region R4 including an entire region exposed from the opening 112r on the main surface 5s of the base 5. On the other hand, the matte surface is not formed in a region R5 other than the fourth region R4 on the main surface 5s of the base 5 (set as a flat surface). As illustrated in the figure, the fourth region R4 does not have to reach a straight line L1 passing through the outer edge of the vibrating element 30 on the movable portion 15 side, or may extend beyond the straight line L1. Note that the matte surface does not have to be formed in the entire portion of the base 5 exposed from the opening 112r, and the matte surface may be formed at least in a part. In FIG. 19, the fourth region R4 is hatched for convenience.

Similarly to the optical unit 1, the optical characteristics of the optical unit 2H described above are improved as a result of suppressing stray light by formation of the matte surface.

[First Modification of Optical Device]

Figure 20:
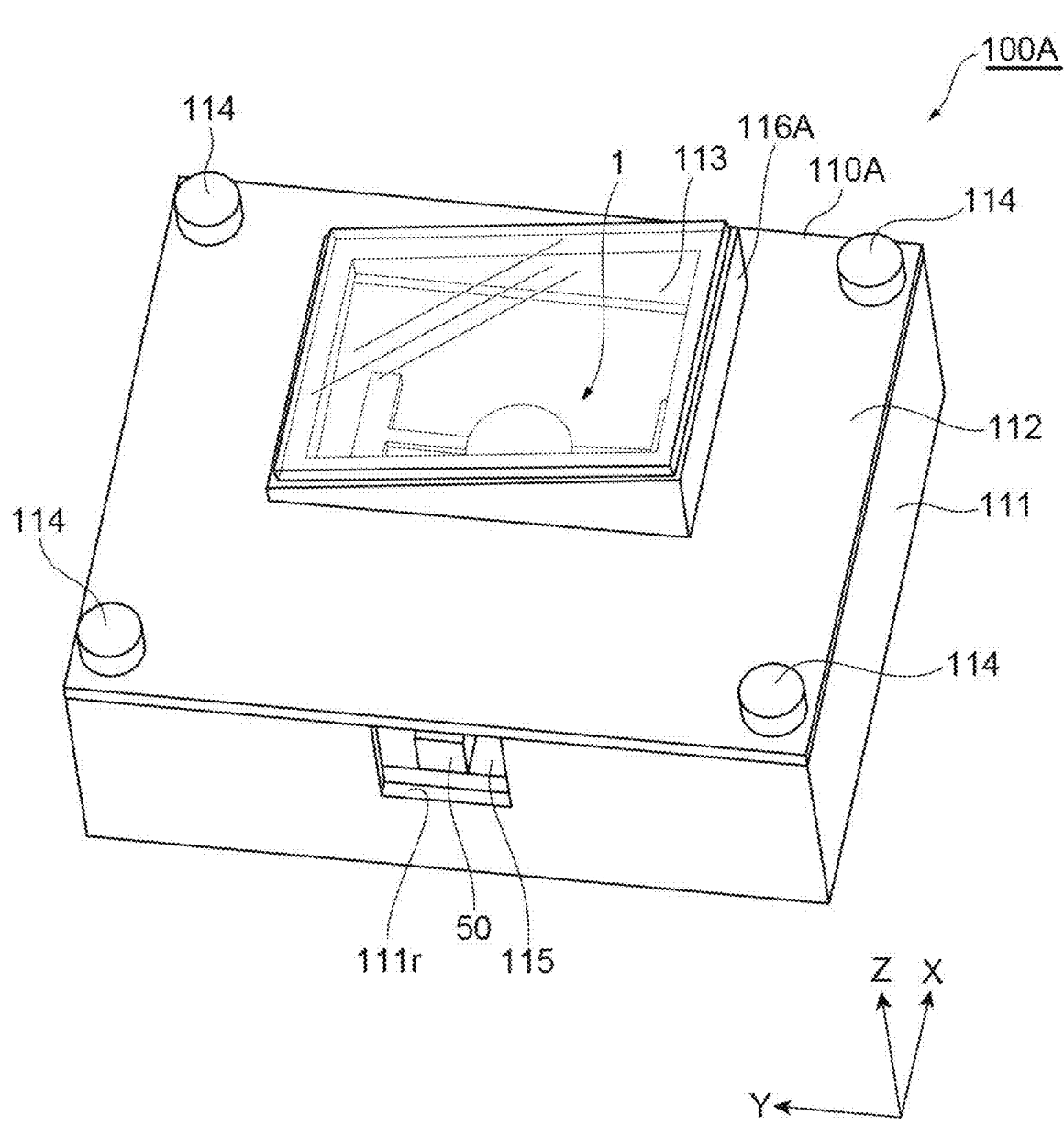
FIG. 20 is a perspective view illustrating an optical device according to a first modification.

FIG. 20 is a perspective view illustrating an optical device according to a first modification. As illustrated in FIG. 20, when compared to the optical device 100, the optical device 100A is different from the optical device 100 in that a package 110A is provided instead of the package 110, and is the same as the optical device 100 in other respects.

The package 110A further has a frame 116A provided on the lid 112. The frame 116A is erected on the lid 112 along an inner edge of the opening 112r of the lid 112. The window member 113 is attached to atop of the frame 116A, and the opening 112r is sealed. A height of the frame 116A from the lid 112 is gradually decreased (or gradually increased) from one side toward the other side in the Y-axis direction. Therefore, the window member 113 is inclined in the Y-axis direction (direction orthogonal to the scanning direction of light). By inclining the window member 113 in this way, it is possible to suppress stray light emitted to the outside through the window member 113.

[Second Modification of Optical Device]

Figure 21:
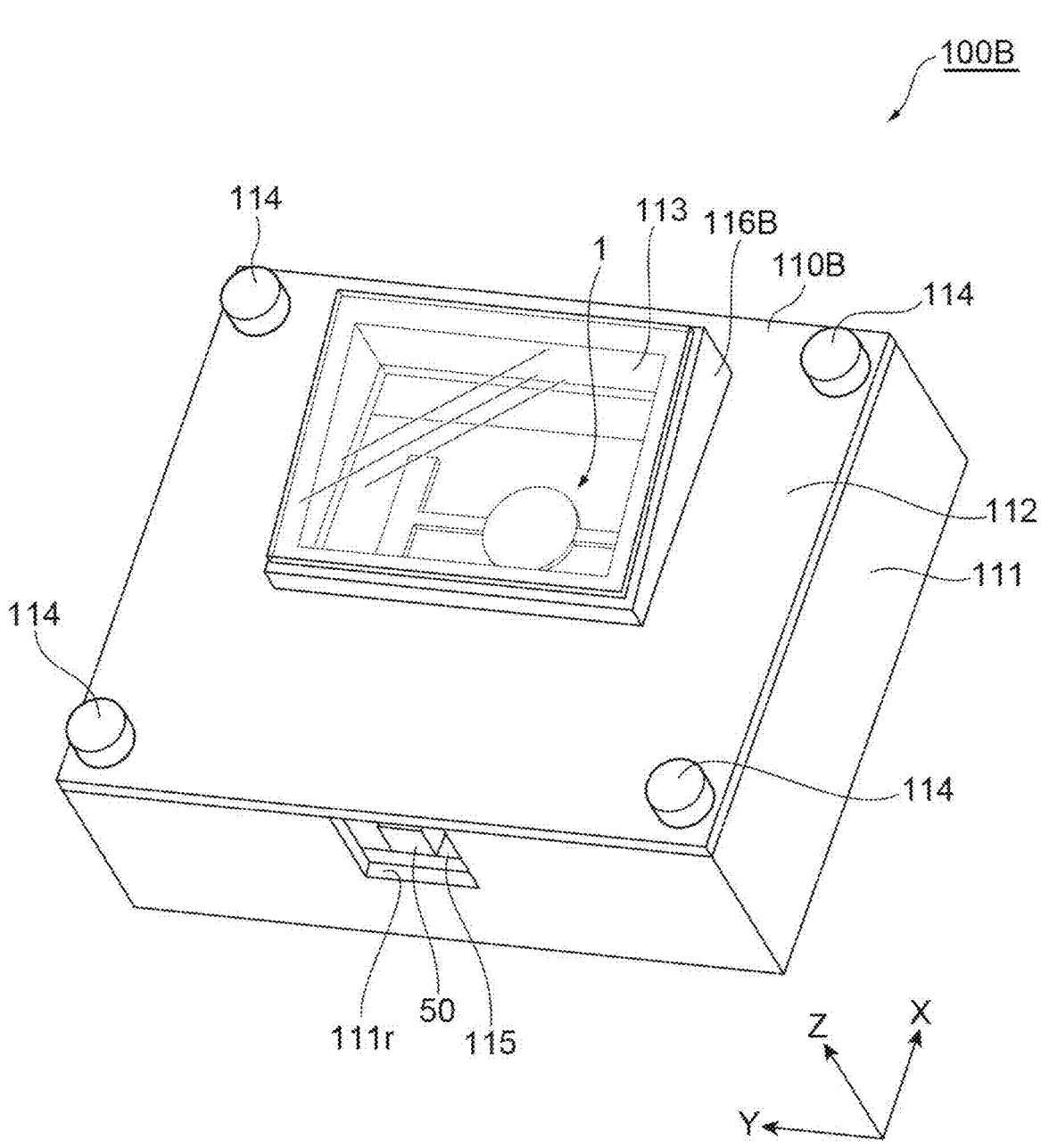
FIG. 21 is a perspective view illustrating an optical device according to a second modification.

FIG. 21 is a perspective view illustrating an optical device according to a second modification. As illustrated in FIG. 21, when compared to the optical device 100, the optical device 100B is different from the optical device 100 in that a package 110B is provided instead of the package 110, and is the same as the optical device 100 in other respects.

The package 110B further has a frame 116B provided on the lid 112. The frame 116B is erected on the lid 112 along the inner edge of the opening 112r of the lid 112. The window member 113 is attached to atop of the frame 116B, and the opening 112r is sealed. A height of the frame 116B from the lid 112 is gradually decreased (or gradually increased) from one side toward the other side in the X-axis direction. Therefore, the window member 113 is inclined in the X-axis direction (the scanning direction of light). By inclining the window member 113 in this way, it is possible to suppress stray light emitted to the outside through the window member 113.

[Third Modification of Optical Device]

Figure 22:
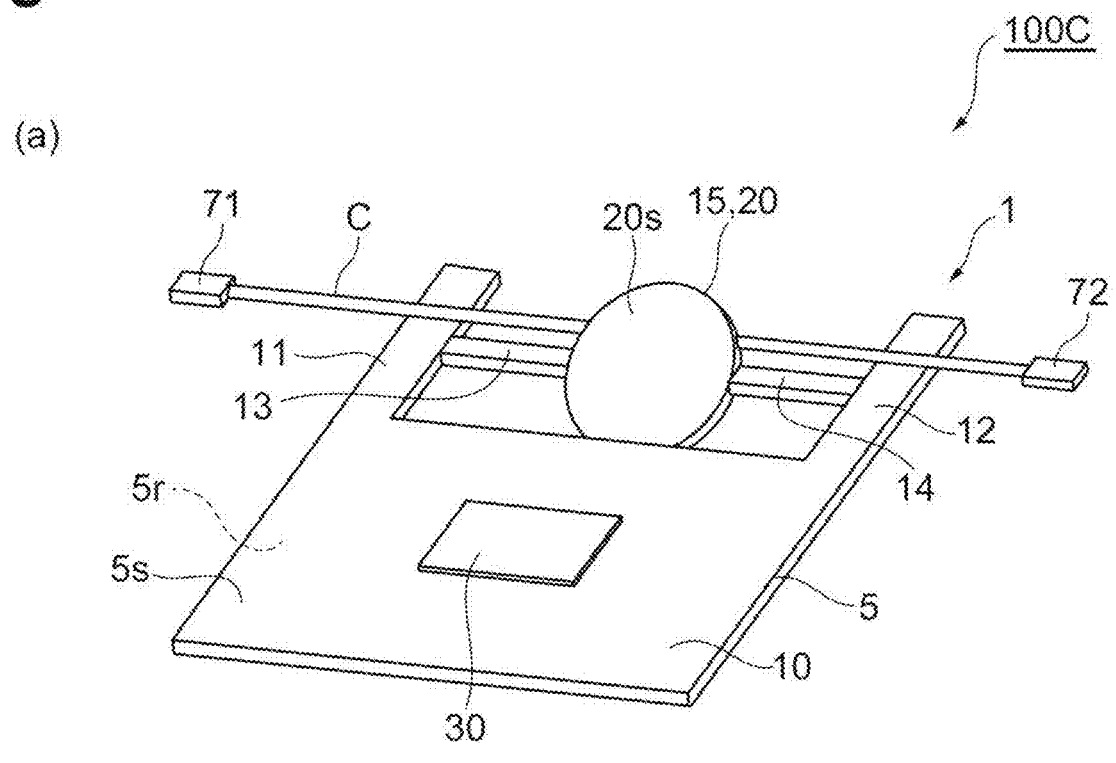
FIG. 22 is a perspective view illustrating an optical device according to a third modification.
Figure 22:
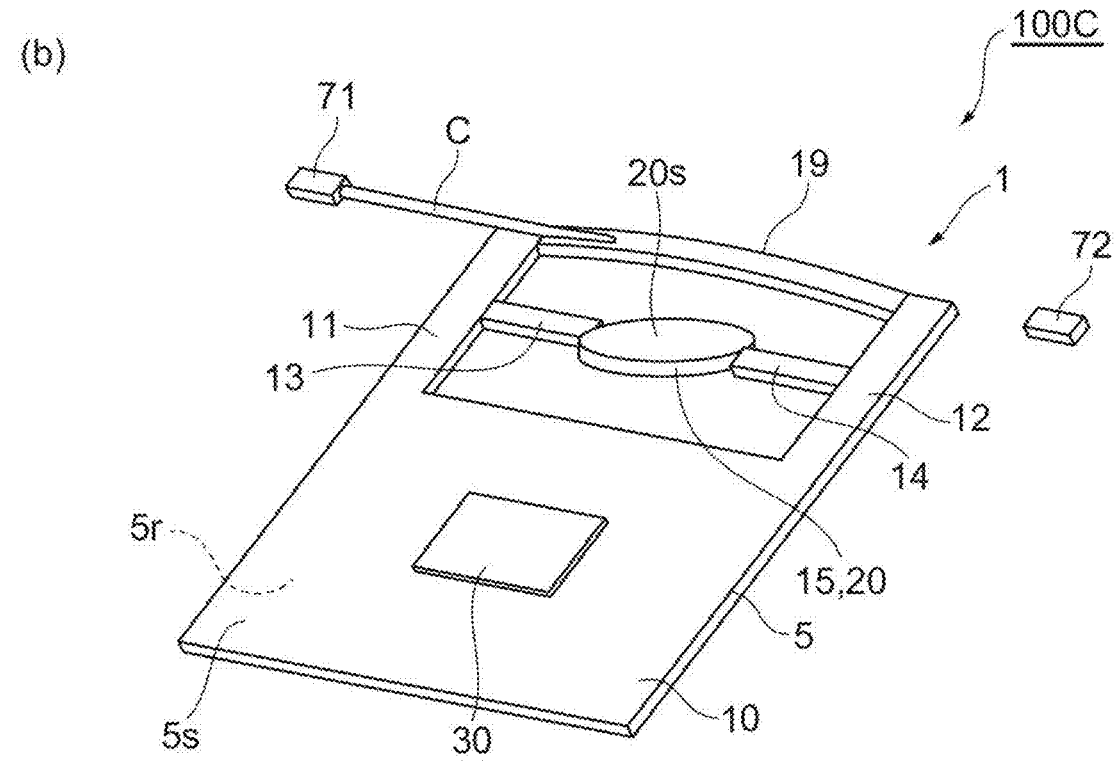

FIG. 22 is a perspective view illustrating an optical device according to a third modification. In FIG. 22, the package 110 and the wiring board 115 are omitted. As illustrated in FIG. 22, when compared to the optical device 100, the optical device 100C according to the third modification is different from the optical device 100 in that a light source 71 and a detector 72 are further included, and is the same as the optical device 100 in other respects.

The light source 71 outputs light C (for example, laser light). The detector 72 is disposed on an optical axis of the light C output from the light source 71 to detect the light C. The detector 72 may be, for example, a single element PD, APD, SiPM, or an array thereof, a sensor, an image sensor, or a position detection sensor. The light source 71 and the detector 72 are disposed so that the optical axis of the light C interferes with a part of the base 5 by displacement of the base 5 in response to vibration of the vibrating element 30. In FIG. 22(a), the optical axis of the light C interferes with the movable portion 15 in response to oscillation of the movable portion 15. On the other hand, in FIG. 22(b), a connecting portion 19 connecting the first extending portion 11 and the second extending portion 12 to each other is provided on the opposite side from the support portion 10 with the movable portion 15 interposed therebetween with respect to the base 5, and the optical axis of the light C interferes with the connecting portion 19 in response to deformation (displacement) of the connecting portion 19. Note that the connecting portion 19 has, for example, a cross-sectional shape (cross-sectional shape on an X-Z plane) similar to that of the first connecting portion 13 and the second connecting portion 14.

According to the optical device 100C, it is possible to detect the amplitude (deflection angle) of oscillation of the optical surface 20s (movable portion 15) based on output of light output from the light source 71 and detected by the detector 72 without being blocked by the base 5. Note that, in the illustrated example, a description has been given of an example in which the light source 71 and the detector 72 are provided outside the optical unit 1. However, the light source 71 and/or the detector 72 may be provided on the base 5. For example, one of the light source 71 and the detector 72 may be provided on the first extending portion 11 or the second extending portion 12 so that the optical axis of the light C interferes with the movable portion 15. Further, a through-hole may be formed at a position on the movable portion 15 side of the vibrating element 30 of the support portion 10, and the light source 71 may be disposed so as to project from the through-hole toward the main surface 5s. Further, the light source 71 and the detector 72 may be provided so that the optical axis of the light C interferes with any portion without being limited to the movable portion 15 and the connecting portion 19. By forming a matte surface in a region with which the optical axis of the light C can interfere on the main surface 5s of the base 5, it is possible to suppress stray light of the light C to accurately detect the deflection angle.

Note that, in the above example, the detector 72 is disposed so as to detect the light C transmitted without being blocked by a part of the base 5. However, the detector 72 may be disposed to detect the light C reflected by a part of the base 5. More specifically, the detector 72 may be disposed to detect the light C reflected by the side surface 5f of the base 5 or the connecting portion 19. Even in this case, it is possible to detect the amplitude (deflection angle) of oscillation of the optical surface 20s (movable portion 15) based on output of the detector 72.

Other Modifications

Even though the modifications of the optical unit and the optical device have been described above, the present disclosure is not limited to the modifications and may be further modified. For example, the optical devices 100, 100A, and 100B may include any of the optical units 2A, 2C, 2D, 2E, 2F, 2G, and 2H in place of the optical unit 1. Further, in the optical units 1, 2A, 2C, 2D, 2E, 2F, 2G, and 2H, the configurations of the respective parts may be applied to each other.

For example, the stress relaxation portion 16 of the optical unit 2C may be applied to the optical unit 2A in which the optical surface 20s is directly provided on the movable portion 15. Further, the stress relaxation portion 16 of the optical unit 2C or the stress relaxation portion 21 of the optical unit 2D may be applied to the transmission type optical unit 2E. Further, the stress relaxation portion 16 and the stress relaxation portion 21 may be used in combination. Further, the electrical connection forms of the vibrating elements of the optical units 2F and 2G may be applied to other optical units 2A, 2C, 2D, 2E, and 2H.

Further, in the above example, the vibrating element 30 is provided on the main surface 5s of the base 5. However, for example, the vibrating element 30 may be provided on the back surface 5r of the base 5 depending on the required vibration mode. In each of the above-mentioned optical units, the matte surface may be formed only in the region corresponding to the first connecting portion 13 and the second connecting portion 14 on the main surface 5s.

INDUSTRIAL APPLICABILITY

An optical unit, an optical device, and a method for manufacturing the optical unit capable of improving optical characteristics are provided.

REFERENCE SIGNS LIST 1, 2A, 2C, 2D, 2E, 2F, 2G, 2H: optical unit, 5: base, 5s: main surface, 5r: back surface, 5f: side surface, 10: support portion, 11: first extending portion, 12: second extending portion, 13: first connecting portion, 14: second connecting portion, 15: movable portion, 16, 21: stress relaxation portion, 20s, 60s, 60r: optical surface, 30: vibrating element, 31: upper electrode, 31a: first portion, 31b: second portion, 71: light source, 72: detector, 100, 100A, 100B: optical device, 110, 110A, 110B: package, 112r: opening, R1: first region, R2: second region, R3: third region.

The invention claimed is:

1. An optical unit comprising:
a base having a main surface and a back surface on an opposite side from the main surface, and being made of metal;
an optical surface provided on the main surface; and
a vibrating element provided on the main surface or the back surface, wherein:
the base has:
a support portion;
a first extending portion and a second extending portion extending from the support portion;
a movable portion disposed between the first extending portion and the second extending portion; and
a first connecting portion connecting the first extending portion and the movable portion to each other, and a second connecting portion connecting the second extending portion and the movable portion to each other,
the vibrating element is provided on the support portion, and vibrates the support portion to induce twisting vibration in the first connecting portion and the second connecting portion, thereby oscillating the movable portion,
the optical surface is provided on the main surface in the movable portion, and
a matte surface is formed on at least a part of at least one of a first region on a side of the movable portion of a position where the vibrating element is provided in the support portion on the main surface, a second region corresponding to the first extending portion and the second extending portion on the main surface, and a third region facing the vibrating element on the main surface or the back surface,
wherein the first region is formed in the support portion, and is disposed on the movable portion side with respect to the position in which the vibrating element is provided.

2. The optical unit according to claim 1, wherein:
the vibrating element is provided on the main surface; and
a matte surface is formed on the first region, the second region, and the third region.

3. The optical unit according to claim 1, wherein a matte surface is formed on the entire main surface.

4. The optical unit according to claim 1, wherein:
the base has a side surface connecting the main surface and back surface to each other; and
a matte surface is formed on the entire back surface and side surface.

5. The optical unit according to claim 1, wherein:
the base has a side surface connecting the main surface and back surface to each other; and
at least a part of the side surface is a flat surface.

6. The optical unit according to claim 1, further comprising a stress relaxation portion provided between the optical surface and the first connecting portion and between the optical surface and the second connecting portion to relax stress caused by twist of the first connecting portion and the second connecting portion.

7. The optical unit according to claim 1, further comprising an electrode used for electrical connection of the vibrating element to an outside,
wherein the electrode includes a first portion located on the support portion and the vibrating element and being in contact with the vibrating element, and a second portion provided on the support portion so as to extend from the first portion toward an outer edge of the support portion.

8. An optical device comprising:
the optical unit according to claim 1;
a light source configured to output light; and
a detector disposed on an optical axis of light output from the light source and configured to detect the light,
wherein the light source and the detector are disposed so that the optical axis interferes with a part of the base by displacement of the base in response to vibration of the vibrating element.

9. An optical device comprising:
an optical unit including a base made of metal, an optical surface provided on the base, and a vibrating element provided on the base; and
a package configured to accommodate the optical unit, wherein:
the base has:
a support portion;
a first extending portion and a second extending portion extending from the support portion;

a movable portion disposed between the first extending portion and the second extending portion; and a first connecting portion connecting the first extending portion and the movable portion to each other, and a second connecting portion connecting the second extending portion and the movable portion to each other, the vibrating element is provided on the support portion, and vibrates the support portion to induce twisting vibration in the first connecting portion and the second connecting portion, thereby oscillating the movable portion, the optical surface is provided on the movable portion, the package is provided with an opening for causing light to enter the optical surface, and a matte surface is formed in a portion that does not overlap the opening of the package when viewed in a direction perpendicular to the main surface of the base.

10. A method for manufacturing an optical unit, the method comprising:

a first process of preparing a metal member;

a second process of forming a base from the metal member after the first process, the base having a main surface and a back surface on an opposite side from the main surface; and a third process of roughening at least a part of the base after the second process, wherein:

the base has:

a support portion, a vibrating element being provided thereon;

a first extending portion and a second extending portion extending from the support portion;

a movable portion disposed between the first extending portion and the second extending portion, an optical surface being provided on a side of the main surface of the movable portion; and a first connecting portion connecting the first extending portion and the movable portion to each other, and a second connecting portion connecting the second extending portion and the movable portion to each other, and, in the third process, at least a part of at least one of a first region on a side of the movable portion of a position where the vibrating element is provided in the support portion on the main surface, a second region corresponding to the first extending portion and the second extending portion on the main surface, and a third region facing the vibrating element on the main surface or the back surface is roughened, wherein the first region is formed in the support portion, and is disposed on the movable portion side with respect to the position in which the vibrating element is provided.

11. A method for manufacturing an optical unit, the method comprising:

a first process of preparing a metal member;

a second process of roughening a surface of the metal member after the first process; and a third process of forming a base from the metal member after the second process, the base having a roughened main surface and a roughened back surface on an opposite side from the main surface, wherein:

the base has:

a support portion, a vibrating element being provided thereon;

a first extending portion and a second extending portion extending from the support portion;

a movable portion disposed between the first extending portion and the second extending portion, an optical surface being provided on a side of the main surface of the movable portion; and a first connecting portion connecting the first extending portion and the movable portion to each other, and a second connecting portion connecting the second extending portion and the movable portion to each other, wherein in the second process, at least a part of at least one of a first region on a side of the movable portion of a position where the vibrating element is provided in the support portion on the main surface, a second region corresponding to the first extending portion and the second extending portion on the main surface, and a third region facing the vibrating element on the main surface or the back surface is roughened, and wherein the first region is formed in the support portion, and is disposed on the movable portion side with respect to the position in which the vibrating element is provided.

* * * * *